(12) United States Patent  (10) Patent No.: US 7,294,404 B2
Krisko et al.  (45) Date of Patent: Nov. 13, 2007

(54) GRADED PHOTOCATALYTIC COATINGS

(75) Inventors: Annette J. Krisko, Prairie du Sac, WI (US); Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 306 days.

(21) Appl. No.: 11/021,482

(22) Filed: Dec. 22, 2004

(65) Prior Publication Data

US 2005/0137084 A1  Jun. 23, 2005

Related U.S. Application Data

(60) Provisional application No. 60/531,755, filed on Dec. 22, 2003.

(51) Int. Cl.
*B32B 17/06* (2006.01)
(52) U.S. Cl. ............... 428/428; 428/432; 428/698; 428/699; 428/701
(58) Field of Classification Search .......... 428/428, 428/432, 698, 699, 701
See application file for complete search history.

(56) References Cited

U.S. PATENT DOCUMENTS

| | | | |
|---|---|---|---|
| 1,256,818 A | 2/1918 | Nile | 206/454 |
| 2,780,553 A | 2/1957 | Pawlyk | 106/1 |
| 2,808,351 A | 10/1957 | Colbert | 117/211 |
| 3,505,092 A | 4/1970 | Ryan | 117/33.3 |
| 3,528,906 A | 9/1970 | Cash, Jr. | 204/298 |
| 3,679,291 A | 7/1972 | Apfel | 359/587 |
| 3,727,666 A | 4/1973 | Vander Sluis | 164/72 |
| 3,829,197 A | 8/1974 | Thelen | 350/164 |
| 3,840,451 A | 10/1974 | Golyanov | 204/192 |
| 3,844,924 A | 10/1974 | Cunningham | 204/298 |
| 3,852,098 A | 12/1974 | Bloss | 117/106 |
| 3,854,796 A | 12/1974 | Thelen | 350/164 |

(Continued)

FOREIGN PATENT DOCUMENTS

CA  2290999  5/1998

(Continued)

OTHER PUBLICATIONS

Anderson et al., "Improved Photocatalytic Activity and Characterization of Mixed $TiO_2/SiO_2$ and $TiO_2/Al_2O_3$ Materials", *J. Phys. Chem.*, 1997, 101, 2611-2616.

(Continued)

*Primary Examiner*—G. Blackwell
(74) *Attorney, Agent, or Firm*—Fredrikson & Byron, P.A.

(57) ABSTRACT

The invention provides graded photocatalytic coatings. In one aspect, the invention provides a substrate carrying a photocatalytic coating that includes a first graded film region and a second graded film region. The first graded film region has a substantially continuously decreasing concentration of a first transparent dielectric material and a substantially continuously increasing concentration of a second transparent dielectric material. The second graded film region has a substantially continuously decreasing concentration of the second transparent dielectric material and a substantially continuously increasing concentration of a third transparent dielectric material. In certain embodiments, the first transparent dielectric material comprises silicon dioxide, the second transparent dielectric material comprises zirconium oxide, and the third transparent dielectric material comprises titanium oxide. The invention also provides methods and equipment for depositing graded photocatalytic coatings.

36 Claims, 4 Drawing Sheets

U.S. PATENT DOCUMENTS

| | | | |
|---|---|---|---|
| 3,925,182 A | 12/1975 | Carmichael | 204/192 |
| 3,934,961 A | 1/1976 | Itoh et al. | 350/164 |
| 3,968,018 A | 7/1976 | Lane | 204/192 |
| 3,970,037 A | 7/1976 | Sopko | 118/48 |
| 3,990,784 A | 11/1976 | Gelber | 350/166 |
| 4,029,566 A | 6/1977 | Brandmair | 204/290.08 |
| 4,045,125 A | 8/1977 | Farges | 350/166 |
| 4,052,520 A | 10/1977 | Chang | 427/164 |
| 4,060,660 A | 11/1977 | Carlson | 428/408 |
| 4,107,350 A | 8/1978 | Berg | 427/38 |
| 4,130,672 A | 12/1978 | Onoki | 427/164 |
| 4,166,018 A | 8/1979 | Chapin | 204/192.12 |
| 4,194,022 A | 3/1980 | Gillery | 427/109 |
| 4,212,663 A | 7/1980 | Aslami | 65/144 |
| 4,212,903 A | 7/1980 | Schnell | 427/127 |
| 4,214,014 A | 7/1980 | Hofer | 427/40 |
| 4,216,259 A | 8/1980 | Groth | 428/216 |
| 4,238,276 A | 12/1980 | Kinugawa | 216/23 |
| 4,252,629 A | 2/1981 | Bewer | 204/290.03 |
| 4,261,722 A | 4/1981 | Novak | 65/60 |
| 4,322,276 A | 3/1982 | Meckel | 204/192 |
| 4,332,922 A | 6/1982 | Kossmehl | 525/478 |
| 4,336,119 A | 6/1982 | Gillery | 204/192.13 |
| 4,351,861 A | 9/1982 | Henery | 428/255.1 |
| 4,377,613 A | 3/1983 | Gordon | 428/212 |
| 4,422,917 A | 12/1983 | Hayfield | 204/196.01 |
| 4,440,822 A | 4/1984 | Gordon | 428/216 |
| 4,465,575 A | 8/1984 | Love et al. | 204/192 |
| 4,466,258 A | 8/1984 | Sando | 68/56 |
| 4,466,877 A | 8/1984 | McKelvey | 204/298.23 |
| 4,485,146 A | 11/1984 | Mizuhashi | 428/428 |
| 4,486,286 A | 12/1984 | Lewin | 204/192 |
| 4,503,125 A | 3/1985 | Nelson | 428/408 |
| 4,504,519 A | 3/1985 | Zelez | 427/39 |
| 4,568,622 A | 2/1986 | Minami | 430/51 |
| 4,569,738 A | 2/1986 | Kieser | 204/173 |
| 4,571,350 A | 2/1986 | Parker | 427/109 |
| 4,576,864 A | 3/1986 | Krautter | 428/328 |
| 4,661,409 A | 4/1987 | Kieser | 428/408 |
| 4,673,475 A | 6/1987 | Windischmann | 204/192.11 |
| 4,704,339 A | 11/1987 | Green | 428/689 |
| 4,713,311 A | 12/1987 | Senske | 430/127 |
| 4,717,622 A | 1/1988 | Kurokawa | 428/408 |
| 4,725,345 A | 2/1988 | Sakamoto | 204/192.31 |
| 4,728,529 A | 3/1988 | Etzkorn | 427/39 |
| 4,732,454 A | 3/1988 | Saito | 350/164 |
| 4,737,252 A | 4/1988 | Hoffman | 204/192.16 |
| 4,769,291 A | 9/1988 | Belkind | 428/630 |
| 4,777,090 A | 10/1988 | Ovshinsky | 428/408 |
| 4,780,334 A | 10/1988 | Ackerman | 427/248.1 |
| 4,798,660 A | 1/1989 | Ermer | 204/192.17 |
| 4,814,056 A | 3/1989 | Welty | 204/298 |
| 4,816,127 A | 3/1989 | Eltoukhy | 204/192.15 |
| 4,849,081 A | 7/1989 | Ross | 204/192.15 |
| 4,851,095 A | 7/1989 | Scobey | 204/192.12 |
| 4,859,493 A | 8/1989 | Lemelson | 427/451 |
| 4,861,680 A | 8/1989 | Meyer | 428/623 |
| 4,882,827 A | 11/1989 | Kusumi | 29/527.2 |
| 4,894,133 A | 1/1990 | Hedgcoth | 204/192.15 |
| 4,915,977 A | 4/1990 | Okamoto | 427/37 |
| 4,919,778 A | 4/1990 | Dietrich | 204/192.27 |
| 4,931,778 A | 6/1990 | Guajardo | 340/664 |
| 4,952,430 A | 8/1990 | Bowser | 428/34 |
| 4,961,958 A | 10/1990 | Desphandey | 427/38 |
| 4,981,568 A | 1/1991 | Taranko | 204/192.31 |
| 5,006,248 A | 4/1991 | Anderson | 210/500.25 |
| 5,008,002 A | 4/1991 | Uno | 204/192.31 |
| 5,020,288 A | 6/1991 | Swensen | 52/202 |
| 5,026,415 A | 6/1991 | Yamamoto | 65/305 |
| 5,032,421 A | 7/1991 | Sarma | 427/38 |
| 5,035,784 A | 7/1991 | Anderson | 204/158.14 |
| 5,047,131 A | 9/1991 | Wolfe | 204/192.23 |
| 5,071,206 A | 12/1991 | Hood | 359/360 |
| 5,073,241 A | 12/1991 | Watanabe | 204/192.15 |
| 5,073,450 A | 12/1991 | Nietering | 428/336 |
| 5,090,985 A | 2/1992 | Soubeyrand | 65/60.52 |
| 5,104,539 A | 4/1992 | Anderson | 210/500.25 |
| 5,105,310 A | 4/1992 | Dickey | 359/586 |
| 5,106,671 A | 4/1992 | Amberger | 428/215 |
| 5,107,643 A | 4/1992 | Swensen | 52/202 |
| 5,108,574 A | 4/1992 | Kirs | 208/298.22 |
| 5,126,218 A | 6/1992 | Clarke | 429/245 |
| RE34,035 E | 8/1992 | Dimigen | 428/244 |
| 5,139,633 A | 8/1992 | Kashida | 204/192.15 |
| 5,165,972 A | 11/1992 | Porter | 428/1 |
| 5,171,414 A | 12/1992 | Amberger | 204/192.26 |
| 5,190,807 A | 3/1993 | Kimock | 428/216 |
| 5,194,990 A | 3/1993 | Boulos | 359/587 |
| 5,196,400 A | 3/1993 | Chen | 505/476 |
| 5,201,926 A | 4/1993 | Szczyrbowski | 65/60.2 |
| 5,209,996 A | 5/1993 | Kashida | 430/5 |
| 5,211,759 A | 5/1993 | Zimmerman | 118/723 |
| 5,245,468 A | 9/1993 | Demiryont | 359/359 |
| 5,254,392 A | 10/1993 | Burns et al. | 428/212 |
| 5,284,539 A | 2/1994 | McKernan | 156/154 |
| 5,286,524 A | 2/1994 | Slutz | 427/249 |
| 5,302,449 A | 4/1994 | Eby | 428/336 |
| 5,306,547 A | 4/1994 | Hood | 428/213 |
| 5,318,830 A | 6/1994 | Takamatsu | 428/246 |
| 5,338,422 A | 8/1994 | Belkind | 204/192.12 |
| 5,342,676 A | 8/1994 | Zagdoun | 428/216 |
| 5,346,600 A | 9/1994 | Nieh | 204/192.3 |
| 5,354,446 A | 10/1994 | Kida | 204/298.22 |
| 5,356,718 A | 10/1994 | Athey | 428/428 |
| 5,366,764 A | 11/1994 | Sunthankar | 427/248.1 |
| 5,378,527 A | 1/1995 | Nakanishi | 428/216 |
| 5,394,269 A | 2/1995 | Takamatsu | 359/580 |
| 5,401,543 A | 3/1995 | O'Neill | 427/580 |
| 5,405,517 A | 4/1995 | Lampkin | 204/192.12 |
| 5,415,756 A | 5/1995 | Wolfe | 204/192.23 |
| 5,424,130 A | 6/1995 | Nakanishi | 428/410 |
| 5,453,459 A | 9/1995 | Roberts | 524/123 |
| 5,470,661 A | 11/1995 | Bailey | 428/408 |
| 5,476,713 A | 12/1995 | Abiko | 428/332 |
| 5,482,602 A | 1/1996 | Cooper | 204/192.11 |
| 5,498,475 A | 3/1996 | Takigawa | 428/334 |
| 5,507,930 A | 4/1996 | Yamashita | 204/192.15 |
| 5,514,485 A | 5/1996 | Ando | 428/702 |
| 5,520,996 A | 5/1996 | Balian | 428/216 |
| 5,529,631 A | 6/1996 | Yoshikawa | 118/78 |
| 5,558,751 A | 9/1996 | Mahler | 204/298.26 |
| 5,569,362 A | 10/1996 | Lerbet | 204/192.16 |
| 5,569,501 A | 10/1996 | Bailey | 427/577 |
| 5,589,280 A | 12/1996 | Gibbons | 428/626 |
| 5,593,784 A | 1/1997 | Chinzi | 428/413 |
| 5,593,786 A | 1/1997 | Parker | 428/426 |
| 5,594,585 A | 1/1997 | Komatsu | 359/512 |
| 5,595,813 A | 1/1997 | Ogawa | 428/212 |
| 5,595,825 A | 1/1997 | Guiselin | 428/428 |
| 5,597,622 A | 1/1997 | Zoller | 427/563 |
| 5,599,422 A | 2/1997 | Adams | 156/510 |
| 5,605,609 A | 2/1997 | Ando | 204/192.23 |
| 5,609,924 A | 3/1997 | McCurdy | 427/475 |
| 5,611,899 A | 3/1997 | Maass | 204/298.08 |
| 5,616,225 A | 4/1997 | Sieck | 204/298.14 |
| 5,618,388 A | 4/1997 | Seeser | 204/192.12 |
| 5,618,590 A | 4/1997 | Naruse | 427/528 |
| 5,620,572 A | 4/1997 | Bjornard | 204/192.12 |
| 5,624,423 A | 4/1997 | Anjur | 604/385.21 |
| 5,624,760 A | 4/1997 | Collins | 428/426 |
| 5,633,208 A | 5/1997 | Ishikawa | 438/699 |
| 5,643,423 A | 7/1997 | Kimock | 204/192.35 |
| 5,643,432 A | 7/1997 | Qiu | 205/50 |
| 5,645,699 A | 7/1997 | Sieck | 204/192.12 |

| | | | | | | | |
|---|---|---|---|---|---|---|---|
| 5,645,900 A | 7/1997 | Ong | 427/571 | 6,261,693 B1 | 7/2001 | Veerasamy | 428/408 |
| 5,669,144 A | 9/1997 | Hahn | 30/346.54 | 6,270,633 B1 | 8/2001 | Onaka | 204/192.12 |
| 5,670,293 A | 9/1997 | Naruse | 427/249 | 6,299,981 B1 | 10/2001 | Azzopardi | 428/429 |
| 5,674,625 A | 10/1997 | Takahashi | 428/428 | 6,319,326 B1 | 11/2001 | Koh | 118/718 |
| 5,674,658 A | 10/1997 | Burberry | 430/262 | 6,326,079 B1 | 12/2001 | Philippe | 428/325 |
| 5,679,431 A | 10/1997 | Chen | 428/65.3 | 6,333,084 B1 | 12/2001 | Woodard | 428/34 |
| 5,683,560 A | 11/1997 | Szczyrbowski | 204/298.23 | 6,334,938 B2 | 1/2002 | Kida | 204/298.13 |
| 5,683,561 A | 11/1997 | Hollars | 204/298 | 6,350,397 B1 | 2/2002 | Heikkila | 264/39 |
| 5,698,262 A | 12/1997 | Soubeyrand | 427/255.3 | 6,352,755 B1 | 3/2002 | Finley et al. | 428/100 |
| 5,723,172 A | 3/1998 | Sherman | 427/109 | 6,354,109 B1 | 3/2002 | Boire et al. | 65/60.1 |
| 5,733,660 A | 3/1998 | Makita | 428/426 | 6,362,121 B1 | 3/2002 | Chopin | 502/2 |
| 5,733,669 A | 3/1998 | Veyhl | 428/698 | 6,365,010 B1 | 4/2002 | Hollars | 204/192.12 |
| 5,745,291 A | 4/1998 | Jenkinson | 359/586 | 6,379,746 B1 | 4/2002 | Birch | 427/154 |
| 5,755,867 A | 5/1998 | Chikuni | 106/287.16 | 6,379,776 B1 | 4/2002 | Tada | 428/149 |
| 5,762,674 A | 6/1998 | Maltby, Jr. | 65/60.1 | 6,387,844 B1 | 5/2002 | Fujishima | 502/350 |
| 5,763,087 A | 6/1998 | Falabella | 428/408 | 6,403,686 B1 | 6/2002 | Pickett | 524/431 |
| 5,780,119 A | 7/1998 | Dearnaley | 427/528 | 6,413,581 B1 | 7/2002 | Greenberg | 427/226 |
| 5,780,149 A | 7/1998 | McCurdy et al. | 428/336 | 6,414,213 B2 | 7/2002 | Ohmori | 502/350 |
| 5,780,380 A | 7/1998 | Endoh | 502/300 | 6,425,670 B1 | 7/2002 | Komatsu | 359/507 |
| 5,789,040 A | 8/1998 | Martinu | 427/575 | 6,447,123 B2 | 9/2002 | Tonar | 359/604 |
| 5,811,191 A | 9/1998 | Neuman | 428/427 | 6,451,178 B2 | 9/2002 | Szczyrbowski | 204/192.13 |
| 5,814,196 A | 9/1998 | Hollars | 204/298.15 | 6,461,686 B1 | 10/2002 | Vanderstraeten | 424/453 |
| 5,820,994 A | 10/1998 | Gotoh | 428/451 | 6,465,088 B1 | 10/2002 | Talpaert | 428/307.3 |
| 5,830,252 A | 11/1998 | Finley | 65/60.5 | 6,468,402 B1 | 10/2002 | Vanderstraeten | 204/192.15 |
| 5,830,327 A | 11/1998 | Kolenkow | 204/192.12 | 6,488,824 B1 | 12/2002 | Hollars | 204/192.22 |
| 5,830,332 A | 11/1998 | Babich | 204/192.15 | 6,511,587 B2 | 1/2003 | Vanderstraeten | 204/298.13 |
| 5,846,613 A | 12/1998 | Neuville | 427/575 | 6,570,709 B2 | 5/2003 | Katayama | 359/586 |
| 5,849,200 A | 12/1998 | Heller | 210/748 | 6,635,155 B2 | 10/2003 | Miyamura | 204/192.13 |
| 5,853,866 A | 12/1998 | Watanabe | 428/312.8 | 6,660,365 B1 | 12/2003 | Krisko | 428/149 |
| 5,854,708 A | 12/1998 | Komatsu | 359/512 | 6,677,063 B2 | 1/2004 | Finley | 428/701 |
| 5,866,199 A | 2/1999 | Swidler | 427/154 | 6,679,978 B2 | 1/2004 | Johnson | 204/192.22 |
| 5,866,260 A | 2/1999 | Adams, Jr. | 428/426 | 6,680,135 B2 | 1/2004 | Boire | 428/702 |
| 5,869,187 A | 2/1999 | Nakamura | 428/428 | 6,682,773 B2 | 1/2004 | Medwick et al. | 427/154 |
| 5,869,808 A | 2/1999 | Hyllberg | 219/216 | 6,720,066 B2 | 4/2004 | Talpaert | 428/307.3 |
| 5,871,843 A | 2/1999 | Yoneda | 428/337 | 6,777,091 B2 | 8/2004 | Kijima | 428/428 |
| 5,873,203 A | 2/1999 | Thiel | 52/172 | 6,789,906 B2 | 9/2004 | Tonar | 359/604 |
| 5,874,701 A | 2/1999 | Watanabe | 204/157.15 | 6,800,183 B2 | 10/2004 | Takahashi | 204/298.28 |
| 5,888,593 A | 3/1999 | Petrmichl | 427/563 | 6,818,309 B1 | 11/2004 | Talpaert | 428/432 |
| 5,891,556 A | 4/1999 | Anderson et al. | 428/216 | 6,829,084 B2 | 12/2004 | Takaki | 359/359 |
| 5,935,716 A | 8/1999 | McCurdy et al. | 428/428 | 6,833,089 B1 | 12/2004 | Kawahara | 428/212 |
| 5,939,194 A | 8/1999 | Hashimoto | 428/411 | 6,875,319 B2 | 4/2005 | Nadaud | 204/192.1 |
| 5,939,201 A * | 8/1999 | Boire et al. | 428/432 | 2001/0007715 A1 | 7/2001 | Toyoshima | 428/426 |
| 5,961,843 A | 10/1999 | Hayakawa | 210/748 | 2001/0016262 A1 | 8/2001 | Toyoshima | 204/192.12 |
| 5,965,246 A | 10/1999 | Guiselin et al. | 428/212 | 2002/0014634 A1 | 2/2002 | Koyama | 257/192 |
| 5,968,328 A | 10/1999 | Teschner | 204/298.25 | 2002/0045073 A1 | 4/2002 | Finley | 428/701 |
| 5,972,184 A | 10/1999 | Hollars | 204/298.08 | 2002/0155265 A1 | 10/2002 | Choi | 428/212 |
| 6,013,372 A | 1/2000 | Hayakawa | 428/411.1 | 2002/0155299 A1 | 10/2002 | Harris | 428/428 |
| 6,027,766 A | 2/2000 | Greenberg | 427/226 | 2003/0039843 A1 | 2/2003 | Johnson | 428/432 |
| 6,037,289 A | 3/2000 | Chopin et al. | 502/2 | 2003/0043464 A1 | 3/2003 | Dannenberg | 359/585 |
| 6,045,903 A | 4/2000 | Seino | 428/331 | 2003/0064231 A1 | 4/2003 | Hurst | 428/432 |
| 6,054,227 A | 4/2000 | Greenberg | 428/701 | 2003/0143071 A1 | 7/2003 | Ohtsu | 428/701 |
| 6,068,914 A | 5/2000 | Boire et al. | 428/216 | 2003/0186089 A1 | 10/2003 | Kikuchi | 428/701 |
| 6,071,606 A | 6/2000 | Yamazaki | 428/325 | 2003/0207028 A1 | 11/2003 | Boire | 427/226 |
| 6,071,623 A | 6/2000 | Sugawara | 428/428 | 2003/0235695 A1 | 12/2003 | Greenberg | 428/432 |
| 6,074,981 A | 6/2000 | Tada | 502/224 | 2004/0020761 A1 | 2/2004 | Thomsen | 204/192.12 |
| 6,090,489 A | 7/2000 | Hayakawa | 428/409 | 2004/0032655 A1 | 2/2004 | Kikuchi | 359/444 |
| 6,103,363 A | 8/2000 | Boire et al. | 428/325 | 2004/0063320 A1 | 4/2004 | Hollars | 438/689 |
| 6,114,043 A | 9/2000 | Joret | 428/446 | 2004/0180220 A1 | 9/2004 | Gueneau | 428/446 |
| 6,124,044 A | 9/2000 | Swidler | 428/500 | 2005/0020444 A1 | 1/2005 | Hiraoka | 502/350 |
| 6,154,311 A | 11/2000 | Simmons | 359/359 | 2005/0221098 A1 | 10/2005 | Azzaopardi | 428/446 |
| 6,156,171 A | 12/2000 | Hollars | 204/298.25 | 2005/0233899 A1 | 10/2005 | Anzaki | 502/350 |
| 6,156,409 A | 12/2000 | Doushita | 428/143 | 2006/0014050 A1 | 1/2006 | Gueneau | 428/702 |
| 6,165,256 A | 12/2000 | Hayakawa | 106/13 | 2006/0051597 A1 | 3/2006 | Anzaki | 428/432 |
| 6,165,598 A | 12/2000 | Nelson | 428/212 | | | | |
| 6,165,616 A | 12/2000 | Lemelson | 428/408 | | FOREIGN PATENT DOCUMENTS | | |
| 6,171,659 B1 | 1/2001 | Vanden Brande | 427/523 | | | | |
| 6,191,062 B1 | 2/2001 | Hayakawa | 502/159 | DE | 43 13 284 | 10/1994 | |
| 6,193,378 B1 | 2/2001 | Tonar et al. | 359/603 | DE | 19736925 | 3/1998 | |
| 6,193,856 B1 | 2/2001 | Kida | 204/192.22 | DE | 19644752 | 4/1998 | |
| 6,197,101 B1 | 3/2001 | Matsumura | 106/287.11 | DE | 19831610 | 1/1999 | |
| 6,210,750 B1 | 4/2001 | Cho | 427/190 | DE | 10100221 | 7/2001 | |
| 6,210,779 B1 | 4/2001 | Watanabe | 428/208 | DE | 10100223 | 7/2001 | |
| 6,242,752 B1 | 6/2001 | Soma | 250/504 | EP | 0 207 646 | 1/1987 | |

| EP | 0 470 379 A | 2/1992 |
| --- | --- | --- |
| EP | 0 279 550 | 4/1993 |
| EP | 0 369 581 B | 12/1993 |
| EP | 0 590 477 | 4/1994 |
| EP | 0 601 928 | 6/1994 |
| EP | 0 611 733 | 8/1994 |
| EP | 0 515 847 B1 | 2/1995 |
| EP | 0 636 702 | 2/1995 |
| EP | 0 637 572 | 2/1995 |
| EP | 0 639 655 | 2/1995 |
| EP | 0 657 562 | 6/1995 |
| EP | 0 689 096 A | 12/1995 |
| EP | 0 689 962 A | 1/1996 |
| EP | 0 737 513 | 10/1996 |
| EP | 0 328 257 A | 4/1997 |
| EP | 0 787 696 | 8/1997 |
| EP | 0 820 967 A | 1/1998 |
| EP | 0 771 766 | 9/1998 |
| EP | 0 753 882 | 11/1998 |
| EP | 0 884 288 | 12/1998 |
| EP | 0 799 255 | 2/1999 |
| EP | 0 901 991 | 3/1999 |
| EP | 0 838 535 | 2/2000 |
| EP | 0 850 203 | 1/2001 |
| EP | 0 850 204 | 12/2001 |
| EP | 0 944 557 | 11/2002 |
| EP | 1 254 870 | 11/2002 |
| EP | 0 887 104 | 11/2003 |
| EP | 1 375 444 | 1/2004 |
| EP | 1 411 386 | 4/2004 |
| EP | 1 074 525 | 9/2004 |
| EP | 1 466 665 A | 10/2004 |
| EP | 1 466 665 A1 | 10/2004 |
| EP | 1 500 634 | 1/2005 |
| EP | 1 518 836 | 3/2005 |
| EP | 1 640 149 | 3/2006 |
| FR | 2699164 | 2/1995 |
| FR | 2738812 | 3/1997 |
| FR | 2738813 | 3/1997 |
| FR | 2738836 | 3/1997 |
| FR | 2800731 | 5/2001 |
| FR | 2814094 | 3/2002 |
| FR | 2838734 | 10/2003 |
| FR | 2838735 | 10/2003 |
| FR | 2857885 | 1/2005 |
| FR | 2861385 | 4/2005 |
| FR | 2861386 | 4/2005 |
| FR | 2869897 | 11/2005 |
| GB | 0232680 | 4/1925 |
| GB | 1231280 | 5/1971 |
| GB | 1438462 | 6/1976 |
| GB | 2028376 | 3/1980 |
| GB | 1595061 | 8/1981 |
| GB | 2201428 | 2/1988 |
| GB | 2316687 | 8/1997 |
| GB | 2327428 | 7/1998 |
| JP | 57-140339 A | 8/1982 |
| JP | 60-81048 | 5/1985 |
| JP | 60081048 A | 5/1985 |
| JP | 60081048 | 9/1985 |
| JP | 61-091042 A | 5/1986 |
| JP | 62-161945 A | 7/1987 |
| JP | 01-014129 A | 1/1989 |
| JP | 01-118807 A | 5/1989 |
| JP | 3-122274 A | 5/1991 |
| JP | 3-187039 A | 8/1991 |
| JP | 3-193872 A | 8/1991 |
| JP | 7-149545 A | 6/1995 |
| JP | 7-215074 A | 8/1995 |
| JP | 7-233469 A | 9/1995 |
| JP | 7-508491 A | 9/1995 |
| JP | 7-315874 A | 12/1995 |
| JP | 7-315889 A | 12/1995 |
| JP | 8-011631 A | 1/1996 |
| JP | 8-012378 A | 1/1996 |
| JP | 8-109043 A | 4/1996 |
| JP | 8-134638 A | 5/1996 |
| JP | 8-227006 A | 9/1996 |
| JP | 9-189801 A | 7/1997 |
| JP | 9-202651 A | 8/1997 |
| JP | 9-249967 A | 9/1997 |
| JP | 10-36144 A | 2/1998 |
| JP | 10-048805 A | 2/1998 |
| JP | 11-095014 A | 4/1999 |
| WO | WO 87/06626 | 11/1987 |
| WO | WO 92/17621 A | 10/1992 |
| WO | WO 96/25534 | 8/1996 |
| WO | WO 97/03763 | 2/1997 |
| WO | WO 97/07066 | 2/1997 |
| WO | WO 97/07069 | 2/1997 |
| WO | WO 97/08359 | 3/1997 |
| WO | WO 97/10185 | 3/1997 |
| WO | WO 97/10186 | 3/1997 |
| WO | WO 97/11916 | 4/1997 |
| WO | WO 97/15499 | 5/1997 |
| WO | WO 97/25201 | 7/1997 |
| WO | WO 97/37946 | 10/1997 |
| WO | WO 97/42351 | 11/1997 |
| WO | WO 97/42357 | 11/1997 |
| WO | WO 98/06675 | 2/1998 |
| WO | WO 98/23549 | 6/1998 |
| WO | WO 98/25700 | 6/1998 |
| WO | WO 00/13257 | 3/2000 |
| WO | WO 00/37376 | 6/2000 |
| WO | WO 00/37377 | 6/2000 |
| WO | WO 00/50354 | 8/2000 |
| WO | WO 00/75087 | 12/2000 |
| WO | WO 01/02496 | 1/2001 |
| WO | WO 01/32578 | 5/2001 |
| WO | WO 01/71055 | 9/2001 |
| WO | WO 02/24971 | 3/2002 |
| WO | WO 02/085809 | 10/2002 |
| WO | WO 03/012540 | 2/2003 |
| WO | WO 03/053577 A1 | 3/2003 |
| WO | WO 03/050056 | 6/2003 |
| WO | WO 03/053577 | 7/2003 |
| WO | WO 03/072849 | 9/2003 |
| WO | WO 03/080530 | 10/2003 |
| WO | WO 03/087002 | 10/2003 |
| WO | WO 03/087005 | 10/2003 |
| WO | WO 03/106732 | 12/2003 |
| WO | WO 2004/067464 | 8/2004 |
| WO | WO 2004/085701 | 10/2004 |
| WO | WO 2004/108619 | 12/2004 |
| WO | WO 2004/113064 | 12/2004 |
| WO | WO 2005/000758 | 1/2005 |
| WO | WO 2005/000759 | 1/2005 |
| WO | WO 2005/009914 | 2/2005 |
| WO | WO 2005/012593 | 2/2005 |
| WO | WO 2005/040056 | 5/2005 |
| WO | WO 2005/040058 | 5/2005 |
| WO | WO 2005/102953 | 11/2005 |
| WO | WO 2005/110937 | 11/2005 |

OTHER PUBLICATIONS

Anderson et al., "An Improved Photocatalyst of $TiO_2/SiO_2$ prepared by a Sol-Gel Synthesis", *J. Phys. Chem.*, 1995, 99, 9882-9885.

Chen Wen-mei et al, "The Effect of $SiO_2$ Additive on Super-hydrophilic Property of $TiO_2$-$SiO_2$ Thin Film by Sol-gel Method", *Journal of Wuhan University of Technology-Mater. Sci. Ed.* (Sep. 2001), vol. 16, No. 3, 30-33.

Guan et al, "Enhanced effect and mechanism of $SiO_2$ addition in super-hydrophilic property of $TiO_2$ films" *Surf. And Coating Tech* 173 (2003) pp. 219-223.

Guan, "Relationship between photocatalytic activity, hydrophilicity and self-cleaning effect of $TiO_2/SiO_2$ films" *Surf. And Coating Tech 191* (2005) pp. 155-160.

Guan, "Hydrophilic property of $TiO_2/SiO_2$ mixing films" *Trans. Nonferrous Met. Soc. China* (2004), vol. 14, No. 2, pp. 251-254.

Ingo et al., "XPS studies of $SiO_2$—$TiO_2$ powders prepared by sol-gel process", *Appl. Surf. Sci.* 1993, 70/71A, pp. 230-234.

Lassaletta et al., "Spectroscopic Characterization of Quantum-Sized $TiO_2$ Supported on Silica: Influence of Size and $TiO_2$—$SiO_2$ Interface Composition", *J. Phys. Chem.*, 1995, 99, 484-1490.

Matthews et al., "An Adsorption Water Purifier with in Situ Photocatalytic Regeneration", *J. Catal.* 1988, 113, pp. 549-555.

Minero et al., "Role of Adsorption in Photocatalyzed Reactions of Organic Molecules in Aqueous of $TiO_2$ Suspensions", *Langmuir*, 1992, 113, pp. 481-486.

Miyashita et al., "Enhanced Effect of Vacuum-deposited SiO2 Overlayer on Photo-induced Hydrophilicity of TiO2 Film", *Journal of Materials Science 36* (2001) p. 3877-3884.

Miyashita et al., "Spectrum response of the vacuum-deposited $SiO_2/TiO_2$ multilayer film with improved photo-catalytic activity", *Journal of Materials Science Letters*, 2001, 20, 2137-2140.

Nakamura, et al., "Hydrophilic property of $SiO_2/TiO_2$ double layer films" *Photocatalytic Coatings, Panel Session*, pp. 345-350.

Niwa et al., Ammoxidation of Toluene Over $SiO_2$—$Al_2O_3$ $ZrO_2$—$SiO_2$ and $TiO_2$—$SiO_2$, *J. Catal.* 1981, 69, pp. 69-76.

Novotná, et al., "Photocatalytical $TiO_2/SiO_2$—PDMS layers on glass" *Photocatalytic Coatings, Panel Session*, pp. 383-387.

Ohsaki, et al., "Photocatalytic properties of $SnO_2/TiO_2$ multilayers" *Photocatalytic Coatings, Panel Session*, pp. 369-376.

Ramirez-Del-Solar et al., "Effect of the Method of Preparation on the Texture of $TiO_2$—$SiO_2$ Gels", *J. Non-Cryst. Solids* 1990, 121, pp. 84-89.

Salvado et al., "$TiO_2$—$SiO_2$ glasses prepared by the alkoxide route", *J. Non-Cryst. Solids* 1992, 147/148, pp. 256-261.

Satoh et al., "Sol-gel-derived binary silica glasses with high refractive index", *J. Non-Cryst. Solids* 1992, 146, pp. 121-128.

Schraml-Marth et al., "Porous silica gels and $TiO_2$—$SiO_2$ mixed oxides prepared via the sol-gel process: characterization by spectroscopic techniques", *J. Non-Cryst. Solids* 1992, 143, pp. 93-111.

Shibata, K., et al., "Acidic Properties of Binary Metal Oxides", *Bull. Chem. Soc. Jpn.* 1973, 46, pp. 2985-2988.

Stakheev, et al., "XPS and XAES Study of $TiO_2$—$SiO_2$ Mixed Oxide System", *J. Phys. Chem.* 1993, 97, pp. 5668-5672.

Takeuchi, et al., "Preparation of Titanium-Silicon Binary Oxide Thin Film Photocatalysts by an Ionized Cluster Beam Deposition Method. Their Photocatalytic Activity and Photoinduced Super-Hydrophilicity", *J. Phys. Chem.* 2003, 107, pp. 14278-14282.

Yu et al., "The grain size and surface hydroxyl content of superhydrophilic $TiO_2$—$SiO_2$ composite nanometer thin films" *J. Mat. Sci. Lett.* (2001) 20, pp. 1745-1748.

Veersamy, et al., "Optical and Electronic Properties of Amorphous Diamond." *Diamond and Related Materials*, vol. 2 (1993), pp. 782-787.

"Surface Hardening of Ceramic and Glass Materials," *IBM Technical Disclosure Bulletin*, vol. 36, Issue 1 (Jan. 1993), p. 225.

"Surface Hardening of Ceramic and Glass Materials," *IBM Technical Disclosure Bulletin*, vol. 36, Issue 3 (Mar. 1993), pp. 291-292.

MikroElektronik—High-rate Sputtering System for Two-Sided Coating (HZS-04).

Kobayashi et al., "$V_2O_5WO_3/TiO_2$-$SiO_2$-$SO_4^{2-}$ catalysts: Influence of active components and supports on activities in the selective catalytic reduction of NO by $NH_3$ and in the oxidation of $SO_2$," *App. Cat. B: Enviro 63.* (2006), pp. 104-113.

Abstract—Japanese Patent Publication 4-276066.

Abstract—Japanese Patent Publication 5-214525.

Abstract—Japanese Patent Publication 6-330297.

Derwent Abstract 007612002 (Abstract of JP 879697).

Abstract Japanese Patent Publication 08158048A.

* cited by examiner

GRADED PHOTOCATALYTIC COATINGS

CROSS REFERENCE TO RELATED APPLICATION

The present application claims priority to provisional US patent application filed Dec. 22, 2003 and assigned Ser. No. 60/531,755, the entire disclosure of which is incorporated herein by reference.

FIELD OF THE INVENTION

The present invention provides coatings for glass and other substrates. More particularly, this invention provides photocatalytic coatings. Also provided are methods and equipment for depositing photocatalytic coatings, as well as substrates bearing these coatings.

BACKGROUND OF THE INVENTION

Keeping windows and other glass surfaces clean is a relatively time-consuming and laborious undertaking. In particular, keeping a large number of windows clean is burdensome and, in many cases, is quite expensive. For example, it takes a great deal of time and expense for window washers to regularly clean all the windows of modern glass towers. Even in private homes, the effort involved in keeping windows clean is substantial.

A great deal of work has been done with the goal of developing self-cleaning coatings for windows and other substrates. One major area of research has focused on photocatalytic coatings. Research in this area is founded on the ability of photocatalytic coatings to break down organic materials that come into contact with the coatings. The most powerful photocatalyst appears to be titanium oxide (e.g., titanium dioxide). However, other semiconductors are also known to exhibit photocatalytic properties.

Generally, photocatalytic reactions occur when a semiconductor is irradiated with radiation having a higher energy than the band gap energy of the semiconductor. When radiation that strikes the surface of a photocatalytic coating comprising a semiconductor reaches or exceeds the band gap energy of the semiconductor, an electron is lifted from the valence band to the conduction band, creating a corresponding hole. Some of the excited electrons in the conduction band and some of the holes in the valence band recombine and dissipate the input energy as heat. The lifetime of other holes, however, is sufficient for them to travel to the surface of the coating, where they react with molecules absorbed on the surface of the coating, forming radicals (e.g., OH— and O2—) that can decompose organic matter at the surface of the coating.

Windows would derive great benefit from photocatalytic coatings. For example, such windows would have self-cleaning characteristics. To the extent organic matter is deposited on such a window, the photoactive coating would oxidize the organic deposits, thereby having a cleaning effect on the surface of the window. To the extent residue survives this photocatalysis, such residue would be more easily removed by washing or, for outdoor window surfaces, by run-off rainwater. Thus, a self-cleaning window would be highly desirable.

Photocatalytic coatings typically comprise one or more layers of thin film. This film is desirably selected to impart a number of different properties in the coating. For example, a titanium oxide film is commonly provided to impart photoactivity in the coating. In addition, one or more transparent dielectric films underlying the titanium oxide film are commonly provided. This underlying film desirably serves a number of functions and imparts various advantageous properties in the coating.

For example, the underlying film desirably serves as a good diffusion barrier. Glass substrates typically contain alkali metal ions that can migrate out of the glass and into the photocatalytic film. With soda-lime glass, for example, sodium ions can migrate out of the glass. Film beneath the photocatalytic layer can be used to provide a diffusion barrier that effectively seals the glass and prevents sodium ions from migrating into the photocatalytic layer. Sodium ions can adversely impact the self-cleaning properties of a photocatalytic film. Therefore, the photocatalytic film in a self-cleaning coating is preferably provided with at least some underlying film that is amorphous, dense, or otherwise effective as a diffusion barrier. This is particularly desirable for glass that must endure long term exposure to ultraviolet and/or is exposed to heat, such as during tempering or other heat treatment.

Further, the underlying film desirably has an inner interface that provides strong adhesion to the substrate. It is desirable to assure that the underlying film adheres well to the substrate, as this film serves as the foundation for the rest of the coating. It is also advantageous to minimize the stress in the photocatalytic coating as much as possible, since stress tends to subtract from the adhesive force of the coating. With photocatalytic coatings in particular, it is desirable to minimize stress and establish strong adhesion. Photocatalytic coatings tend to be #1 surface coatings. Therefore, they are typically exposed to more severe environmental conditions (e.g., conditions associated with an outdoor environment, such as periodic contact with rain) than other coatings, such as silver-based low-emissivity coatings, which are typically exposed to the protected atmosphere between the panes of an insulating glass unit. Thus, it is highly desirable to find ways to maximize the durability of photocatalytic coatings, so that delamination does not become a problem for these coatings.

In addition, the film beneath the photocatalytic layer desirably antireflects this layer as much as possible. A tradeoff is sometimes made in photocatalytic coatings whereby the film provided to achieve photoactivity has the effect of increasing the visible reflectance to a higher level than is ideal. As a consequence, windows bearing these coatings commonly have a somewhat mirror-like appearance. Unfortunately, this exaggerates the appearance of dirt on such windows. Thus, it is highly desirable to find ways to minimize the visible reflectance of photocatalytic coatings, so that these coatings do not show an exaggerated dirty appearance.

The film underlying the photocatalytic layer desirably also promotes good color properties in the coating. To the extent a photocatalytic coating has a colored appearance, it is pleasing if the coating exhibits a hue that is blue or blue-green. In most cases, it is preferable to provide a photocatalytic coating that is as color neutral (i.e., colorless) as possible. Thus, the film underlying the photocatalytic film can be used to modify the appearance of the coating (e.g., to modify its color and/or visible reflection).

Unfortunately, it is difficult to optimize all the foregoing coating properties using a single underlying film of any one material. As an alternative, the underlying film can be formed of two or more discrete layers of different materials, each chosen to optimize one or more of the desired coating properties. This, however, leaves the underlying film with at least one additional interface, which, as described below, is preferably avoided.

Many photocatalytic coatings are multi-layer coatings each comprising a plurality of discrete film layers. Each discrete layer typically is homogenous. That is, each layer typically has a composition that is uniform across the thickness of the layer. While discrete, homogenous layers have gained widespread acceptance, they have significant limitations. For example, the stress and adhesion properties are limited for a photocatalytic coating comprising a plurality of discrete film layers. This is due in part to the discrete interfaces that exist between discrete film layers. Unfortunately, stress tends to pile up at each discrete interface in a coating. Therefore, each discrete interface is a potential delamination site that is preferably avoided. Further, the optical opportunities are limited for photocatalytic coatings that comprise discrete, homogenous film layers. A coating of this nature can only achieve limited antireflection and color properties due to the optical limitations of providing each film in the coating as a discrete, homogenous layer.

It would be desirable to provide a photocatalytic coating in which the foregoing limitations are avoided while the desired coating properties are achieved.

SUMMARY OF THE INVENTION

In certain embodiments, the invention provides a substrate bearing a photocatalytic coating. In the present embodiments, the coating comprises, in sequence outwardly: a first graded film region having a substantially continuously decreasing concentration of a first transparent dielectric material and a substantially continuously increasing concentration of a second transparent dielectric material; and a second graded film region having a substantially continuously decreasing concentration of the second transparent dielectric material and a substantially continuously increasing concentration of a third transparent dielectric material, the third transparent dielectric material comprising a photocatalyst In some cases, the photocatalytic coating does not include any discrete interface between homogenous films of different materials. The photocatalytic coating also preferably has a total optical thickness of less than about 920 Å and an average surface roughness of about 2 nm or less. Also, the coating preferably has an exterior photocatalytic film-side visible reflectance less than about 15%, more preferably less than about 13%.

In some embodiments, the photocatalytic coating comprises a homogenous inner film region between the substrate and the first graded film region, the homogenous inner film region comprising the first transparent dielectric material. The homogenous inner film region preferably has a thickness of between about 40 Å and about 200 Å. Also, the first transparent dielectric material is preferably silicon dioxide, such that the homogenous inner film region comprises silicon dioxide. Optimally, the homogenous inner film region consists essentially of silicon dioxide.

In additional embodiments, the photocatalytic coating comprises a homogenous intermediate film region between the first graded film region and the second graded film region, the homogenous intermediate film region comprising the second transparent dielectric material. Preferably, the homogenous intermediate film region has a thickness of between about 40 Å and about 160 Å. Also, the second transparent dielectric material is preferably zirconium oxide, such that the homogenous intermediate film region comprises zirconium oxide. Optimally, the homogenous intermediate film region consists essentially of zirconium oxide.

In further embodiments, the photocatalytic coating comprises a homogenous outer film region further from the substrate than the second graded film region, the homogenous outer film region comprising the third transparent dielectric. Preferably, the homogenous outer film region has a thickness of between about 40 Å and about 160 Å. Also, the third transparent dielectric material is preferably titanium oxide, such that the homogenous outer film region comprises titanium oxide. Optimally, the homogenous outer film region consists essentially of titanium oxide.

In other embodiments, the invention provides a substrate bearing a photocatalytic coating comprising, in sequence outwardly: a first graded film region having a substantially continuously decreasing concentration of silicon dioxide and a substantially continuously increasing concentration of zirconium oxide; and a second graded film region having a substantially continuously decreasing concentration of zirconium oxide and a substantially continuously increasing concentration of titanium oxide.

In some cases, the photocatalytic coating preferably does not include any discrete interface between homogenous films of different materials. In other cases, the photocatalytic coating comprises a homogenous inner film region between the substrate and the first graded film region, the homogenous inner film region consisting essentially of silicon dioxide, a homogenous intermediate film region between the first graded film region and the second graded film region, the homogenous intermediate film region consisting essentially of zirconium oxide, and a homogenous outer film region further from the substrate than the second graded film region, the homogenous outer film region consisting essentially of titanium oxide. Preferably, the homogenous inner film region has a thickness of between about 40 Å and about 200 Å, the homogenous intermediate film region has a thickness of between about 40 Å and about 160 Å, and the homogenous outer film region has a thickness of between about 40 Å and about 160 Å.

In certain embodiments, the invention comprises a substrate bearing a graded photocatalytic coating, the graded photocatalytic coating comprising at least one graded film region having a composition that transitions, with increasing distance from the substrate, from one transparent dielectric material to another, the graded photocatalytic coating having an exterior photocatalytic film-side visible reflectance of less than about 15%. The graded photocatalytic coating is preferably a sputtered coating, preferably does not include any discrete interface between homogenous films of different materials and preferably has a total thickness of less than about 300 Å. Also, the graded film region preferably has a thickness of less than about 100 Å, more preferably less than about 75 Å, and optimally less than about 50 Å. Additionally, the exterior photocatalytic film-side visible reflectance is preferably less than about 13%.

The invention also provides methods for depositing a photocatalytic coating on a substrate. In some embodiments, the method comprises depositing a photocatalytic coating over a major surface of a substrate such that the coating as deposited comprises, in sequence outwardly a first graded film region and a second graded film region. The first graded film region has a substantially continuously decreasing concentration of a first transparent dielectric material and a substantially continuously increasing concentration of a second transparent dielectric material. The second graded film region has a substantially continuously decreasing concentration of the second transparent dielectric and a substantially continuously increasing concentration of a third transparent dielectric material. The third transparent dielectric material comprises a photocatalyst. The first and second graded film regions are preferably each deposited so as to have a thickness of less than about 100 angstroms, more preferably less than about 75 angstroms.

Methods for sputtering depositing a graded photocatalytic coating on a substrate are also provided. While sputtering depositing is a preferred method for depositing a photocatalytic coating, other methods are within the scope of the invention. In certain embodiments, a photocatalytic coating having a first graded film region and a second graded film region is deposited by sputtering. For example, the first graded film region in some embodiments is deposited by sputtering two targets in a shared atmosphere, the two targets being of different composition. Likewise, the second graded film region in some embodiments is deposited by sputtering two targets in a shared atmosphere, the two targets being of different composition. In one particularly preferred embodiment, the first graded film region is deposited by sputtering first and second targets in a shared atmosphere, the first target being a silicon-containing target, the second target being a zirconium containing-target, and wherein the second graded film region is deposited by sputtering third and fourth targets in a shared atmosphere, the third target being a zirconium-containing target, the fourth target being a titanium-containing target.

In other embodiments, a graded photocatalytic coating is sputter deposited over a major surface of a substrate such that the photocatalytic coating as deposited comprises at least one graded film region having a composition that transitions, with increasing distance from the substrate, from one transparent dielectric material to another, wherein at least one of these transparent dielectric materials comprises titania, and wherein the graded film region is deposited at a thickness of less than about 100 angstroms. The at least one graded film region is preferably deposited at a thickness of less than about 75 angstroms, more preferably less than about 50 angstroms.

The invention also provides a substrate having a graded photocatalytic coating deposited over a major surface of the substrate. The graded photocatalytic coating comprises at least one graded film region having a composition that transitions, with increasing distance from the substrate, from one transparent dielectric material to another, wherein at least one of these transparent dielectric materials comprises titania, and wherein the graded film region is deposited at a thickness of less than about 100 angstroms. The substrate preferably has a graded film region deposited at a thickness of less than about 75 angstroms, preferably less than about 50 angstroms. The graded photocatalytic coating is preferably deposited by sputtering, although other film deposition methods are within the scope of the invention.

DETAILED DESCRIPTION OF PREFERRED EMBODIMENTS

Figure 1:
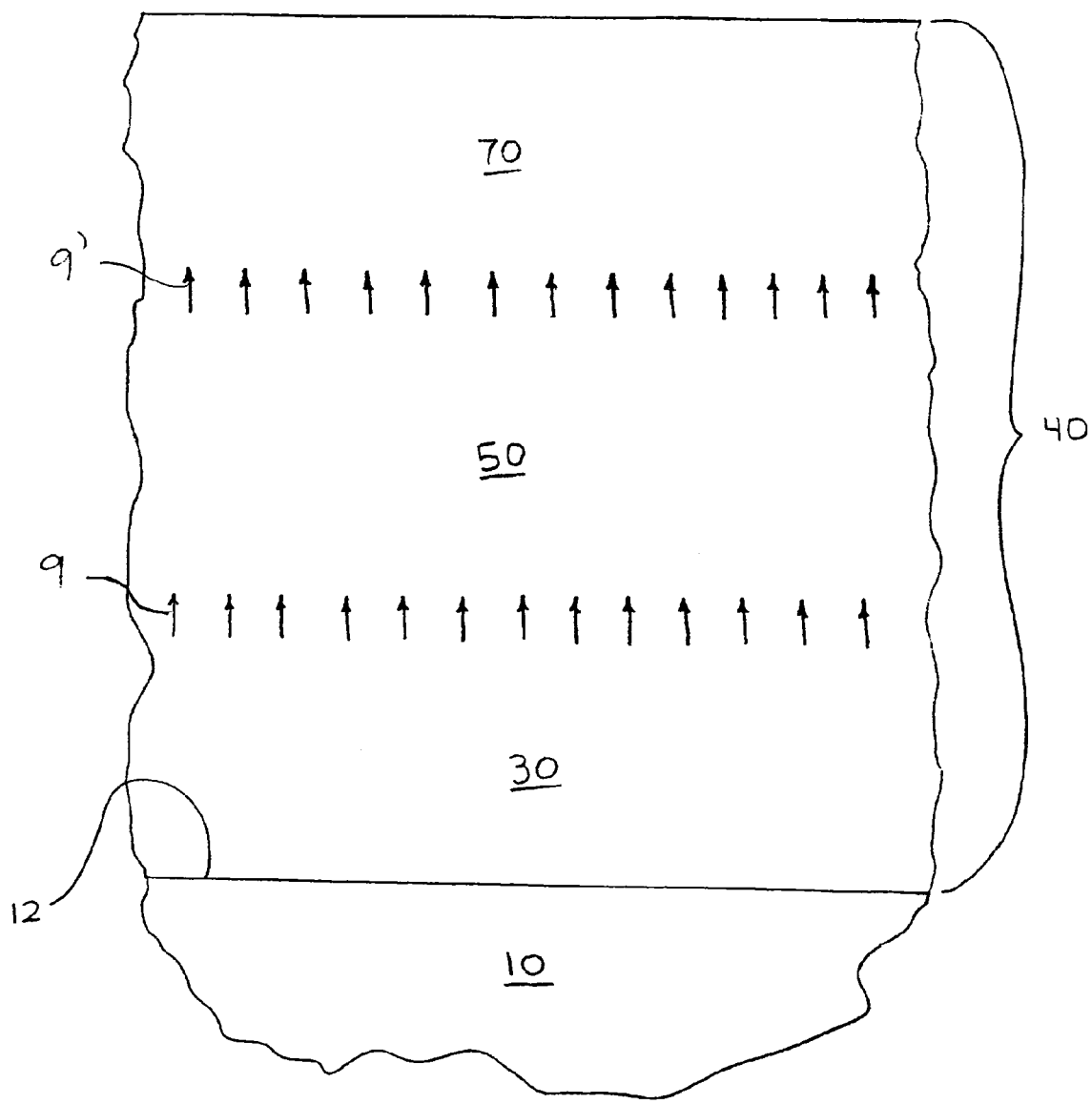
FIG. 1 is a partially broken-away schematic cross-sectional view of a substrate bearing a graded photocatalytic coating in accordance with certain embodiments of the present invention.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The present invention provides a graded photocatalytic coating. The coating comprises photocatalytic film and includes at least one graded film region having a composition that transitions, with increasing distance from the substrate, from one transparent dielectric material to another. That is, the transition occurs as a function of film thickness. Preferably, in each graded film region, the concentration of one transparent dielectric material decreases gradually as the concentration of another transparent dielectric material increases gradually. Thus, there is preferably a smooth transition in each graded film region from one transparent dielectric material to another. A photocatalytic coating comprising a graded film region of this nature can provide exceptional properties.

The term "transparent dielectric" is used herein to refer to any non-metallic (i.e., neither a pure metal nor a metal alloy) compound that includes any one or more metals and is substantially transparent when deposited as a thin film. Included in this definition would be any metal oxide, metal nitride, metal carbide, metal sulfide, metal boride, metal fluoride, and any combination thereof (an oxynitride, oxycarbide, etc.). Further, the term "metal" is defined to include all metals and semi-metals (i.e., metalloids).

In certain embodiments, there is provided a substrate bearing a photocatalytic coating that comprises at least one graded film region, wherein the coated substrate has an exterior photocatalytic film-side visible reflectance of less than 15%. The graded coating can achieve exceptionally low visible reflectance. In fact, particularly preferred embodiments provide a visible reflectance of less than about 13%. Tables 1 and 2 below exemplifies certain embodiments of this nature. In the present embodiments, the coating can comprise one, two, or more graded film regions.

In certain preferred embodiments, the graded photocatalytic coating comprises, in sequence outwardly (i.e., moving away from the substrate), a first graded film region and a second graded film region. Preferably, with increasing distance from the substrate, the first graded film region has a substantially continuously decreasing concentration of a first transparent dielectric material and a substantially continuously increasing concentration of a second transparent dielectric material. Conjointly, with increasing distance from the substrate, the second graded film region preferably has a substantially continuously decreasing concentration of the second transparent dielectric material and a substantially continuously increasing concentration of a third transparent dielectric material. The third transparent dielectric material preferably comprises (e.g., is) a photocatalyst. Thus, the second graded film region preferably comprises photocatalytic film.

Any desired photocatalyst can be used in the present coating. In certain embodiments, the photocatalyst is a material having a refractive index of at least about 2.3 (e.g., between about 2.4 and about 2.7). Typically, the photocatalyst will be a semiconductor. In certain embodiments, the photocatalyst is a metal oxide semiconductor characterized by its ability to absorb ultraviolet radiation and photocatalytically degrade organic materials. The most powerful metal oxide of this nature appears to be titanium oxide (e.g., $TiO_2$). Thus, in preferred embodiments, titanium oxide is used as the photocatalyst. In alternate embodiments, the photocatalyst is another material exhibiting photoactivity, such as an oxide of iron, silver, copper, tungsten, aluminum, zinc, strontium, palladium, gold, platinum, nickel, and/or cobalt. As used herein, the term "photocatalyst" is defined to include any active material, whether currently known or subsequently developed, that has self-cleaning properties (e.g., any active material that is degenerative to contaminants on, or adjacent to, a coating comprising the active material).

In the present embodiments, the first and second graded film regions can be two regions of a larger, continuous graded film region, or they can be separated, for example, by a homogenous intermediate film region. The first graded film region can be deposited directly on the substrate, or a homogenous inner film region and/or additional film can be provided between the substrate and the first graded film region. Such additional film can optionally be provided, for example, to improve adhesion to the substrate, to offset substrate defects, to serve as a diffusion barrier, to provide antireflection, and/or to fine tune color. In the present embodiments, the second graded film region can be the outermost film of the coating, or a homogenous outer film region and/or additional film (e.g., hydrophilic film and/or scratch-resistant film) can be provided over the second graded film region.

In certain particularly preferred embodiments, the graded photocatalytic coating does not include any discrete film interfaces. This can be accomplished by providing a graded film region in place of the sharp transition (i.e., sudden step) that Would otherwise exist at each discrete film interface in the coating. In more detail, the coating in the present embodiments does not include any (i.e., is entirely free of) discrete interface(s) between homogenous films of different materials. Rather, the coating in these embodiments comprises (and in some cases consists essentially of, or consists of) film regions of different transparent dielectric materials interlocked by continuous transition. Coatings of this nature are particularly advantageous because they eliminate discrete film interfaces. This reduces the stress in the coating, thereby decreasing the risk of delamination.

In certain particular embodiments, the thickness of each graded film region in the coating (whether the coating has one or more graded film regions) is less than about 100 angstroms (e.g., between about 5 angstroms and about 100 angstroms), perhaps more preferably less than about 75 angstroms (e.g., between about 5 angstroms and about 75 angstroms), and perhaps optimally less than about 50 angstroms (e.g., between about 5 angstroms and about 50 angstroms). In some cases, this thickness can be selected advantageously so as to be less than about 40 angstroms. Further, when this thickness is selected so as to be below one or more of the maximums noted in this paragraph, the thickness can optionally be greater than about 10 angstroms. In some embodiments, each graded film region (e.g., optionally having a thickness in one or more ranges described in this paragraph) extends between two homogenous film regions of different composition.

It is advantageous to provide the graded photocatalytic coating with at least one homogenous film region, perhaps more preferably with at least two such regions, and perhaps optimally with at least three such regions. Preferably, the film in each homogenous film region does not have a composition that is graded or otherwise varied substantially as a function of film thickness/distance from the substrate. Rather, each homogenous film region preferably is a thickness of film having a composition that is uniform (or at least substantially uniform) across such thickness. Each homogenous film region is bounded by (and transitions gradually into) one or two graded film regions, in contrast to a conventional discrete homogenous film, which is bounded by one or two discrete interfaces (i.e., abrupt interfaces) with other film(s). A homogenous film region, for example, is not bounded by two discrete interfaces with other films, nor is such a film region bounded by one discrete interface with a substrate and another discrete interface with another film.

Providing the graded photocatalytic coating with at least one homogenous film region allows the manufacturer to include in the coating a thickness of material that is selected to optimize one or more desired coating properties. Thus, the material best suited for establishing one or more specific coating properties can be provided in a pure or essentially pure form in each homogenous film region. Further, providing the graded photocatalytic coating with two or three homogenous film regions allows the manufacturer to include in the coating multiple thicknesses of respective materials each selected to optimize different coating properties and/or to serve different functions. This allows the manufacturer to optimize (or balance in a desired manner) numerous coating properties without creating discrete film interfaces in the coating.

In certain embodiments, the photocatalytic coating comprises a homogenous inner film region between the substrate and the first graded film region. In these embodiments, the homogeneous inner film region preferably comprises, and perhaps optimally consists essentially of, the first transparent dielectric material (i.e., the transparent dielectric material that decreases in concentration, with increasing distance from the substrate, in the first graded film region). In one particular embodiment, the inner film region 30 comprises (e.g., consists essentially of, or consists of) amorphous or substantially amorphous film. In certain preferred embodiments, the homogenous inner film region has a thickness of between about 20 Å and about 400 Å, more preferably between about 40 Å and about 200 Å, and perhaps optimally between about 50 Å and about 150 Å. In some advantageous embodiments, this thickness is actually between about 5 angstroms and about 45 angstroms, perhaps more preferably between about 5 angstroms and about 30 angstroms.

Particularly advantageous embodiments provide a homogenous inner film region comprising, and perhaps optimally consisting essentially of, silicon dioxide. Silicon dioxide provides particularly strong adhesion to glass substrates, which typically are formed largely of silicon dioxide. Silicon dioxide also serves as a particularly good diffusion barrier. Moreover, silicon dioxide has substantially the same refractive index as glass, and therefore can be provided as the innermost portion of the coating with minimal impact on the optical properties of the coating. Furthermore, silicon dioxide can be deposited by sputtering, which is the preferred deposition technique for all the film of the present coating. As described below, sputtered film can provide a level of surface roughness that is ideal for achieving a low maintenance window coating.

In certain embodiments, the photocatalytic coating comprises a homogenous intermediate film region between the first and second graded film regions. In these embodiments, the homogeneous intermediate film region preferably comprises, and perhaps optimally consists essentially of, the second transparent dielectric material (i.e., the transparent dielectric material that, with increasing distance from the substrate, increases in concentration in the first graded film region and decreases in concentration in the second graded film region). In certain preferred embodiments, the homogenous intermediate film region has a thickness of between about 20 Å and about 250 Å, preferably between about 30 Å and about 175 Å, more preferably between about 40 Å and about 160 Å, and perhaps optimally between about 50 Å and about 100 Å. In some advantageous embodiments, this thickness is actually between about 5 angstroms and about 45 angstroms, perhaps more preferably between about 5 angstroms and about 30 angstroms.

Particularly advantageous embodiments provide a homogenous intermediate film region comprising, and perhaps optimally consisting essentially of, zirconium oxide. Zirconium oxide is a high index, low absorption material that provides exceptional antireflection properties and good control over color. Zirconium oxide also offers excellent adhesion to most other oxides. In certain preferred embodiments, the second transparent dielectric material is zirconium oxide and the first and third transparent dielectric materials are oxides as well (e.g., silicon dioxide and titanium oxide, respectively). Zirconium oxide can be deposited, for example, by sputtering, which as noted above is the preferred deposition technique for all the film of the present coating.

In certain embodiments, the photocatalytic coating comprises a homogenous outer film region further from the substrate than the second graded film region. In these embodiments, the homogeneous outer film region preferably comprises, and perhaps optimally consists essentially of, the third transparent dielectric material (which is, or comprises, the photocatalyst). In certain preferred embodiments, the homogenous outer film region has a thickness of between about 20 Å and about 250 Å, preferably between about 30 Å and about 175 Å, more preferably between about 40 Å and about 160 Å, and perhaps optimally between about 50 Å and about 100 Å. In some advantageous embodiments, this thickness is actually between about 5 angstroms and about 45 angstroms, perhaps more preferably between about 5 angstroms and about 30 angstroms.

Particularly advantageous embodiments provide a homogenous outer film region comprising, and perhaps optimally consisting essentially of, titanium oxide (e.g., $TiO_2$). Titanium oxide is believed to be the most powerful of the photocatalysts. Titanium oxide also has particularly good chemical durability, and thus can be used as the outermost film of a #1 surface coating. Further, titanium oxide can be deposited by sputtering.

Sputtered films tend to have less surface roughness than is generally preferred for photocatalytic coatings. Conventional wisdom suggests that the surface roughness of a photocatalytic coating should be maximized, so as to maximize the surface area of the coating, thereby maximizing the ability of the coating to remove contaminants by photocatalysis (which is a surface phenomenon). Therefore, providing sputtered film in the present coating is somewhat contrary to conventional wisdom.

Thus, it can be appreciated that certain preferred embodiments of the invention provide a graded photocatalytic coating comprising: substrate/homogenous inner film region→homogenous intermediate film region→homogenous outer film region. Here, the "→" symbol (i.e., an arrow) represents a transition (e.g., a gradual change) in film composition, with increasing distance from the substrate, from one transparent dielectric material to another. In these embodiments, the homogenous inner film region can be provided directly on the substrate, or additional film can be deposited between the substrate and the homogenous inner film region. Such additional film can optionally be provided, for example, to improve adhesion to the substrate, to offset substrate defects, to serve as a diffusion barrier, to provide antireflection, and/or to control color. Further, the homogenous outer film region can be the outermost film of the coating, or additional film (e.g., hydrophilic film and/or scratch-resistant film) can be provided over the homogenous outer film region.

FIG. 1 exemplifies certain particularly preferred embodiments of the invention wherein there is provided a substrate 10 bearing a graded photocatalytic coating 40. Various different substrates can be used in the present invention. In most cases, the substrate is a sheet of transparent material (i.e., a transparent sheet). However, the substrate is not required to be transparent. For most applications, the substrate 10 comprises a transparent or translucent material, such as glass or clear plastic. In many cases, the substrate 10 is a glass pane. A variety of known glass types can be used, and soda-lime glass is expected to be preferred.

Substrates of various size can be used in the present invention. Preferably, large-area substrates are used. Certain embodiments involve a substrate having a width of at least about 0.5 meter, preferably at least about 1 meter, perhaps more preferably at least about 1.5 meters (e.g., between about 2 meters and about 4 meters), and in some cases at least about 3 meters.

In the embodiments exemplified by FIG. 1, the coating 40 comprises a first graded film region 9 and a second graded film region 9'. Here, the coating 40 also comprises a homogenous inner film region 30, a homogenous intermediate film region 50, and a homogenous outer film region 70. In more detail, the homogenous inner film region 30 comprises a first transparent dielectric material, the homogenous intermediate film region 50 comprises a second transparent dielectric material, and the homogenous outer film region 70 comprises a third transparent dielectric material. The first, second, and third transparent dielectric materials desirably are different materials (i.e., have different compositions).

Thus, in various embodiments, the coating 40 includes one or more graded film regions, each characterized by a transition from one dielectric material to another (these dielectric materials having different compositions). In some cases, each such dielectric material comprises at least one element (optionally present by at least 10 atomic percent, and perhaps at least 20 atomic percent, relative to the total number of atoms in such dielectric material) not found in the other dielectric material. For example, one such embodiment provides a coating having only one graded film region, which transitions from silica to titania. In other cases, the dielectric materials contain the same elements, but at least one such element varies in terms of the amount of that element present in each of the dielectric materials. For example, one such embodiment provides a coating having only one graded film region, which transitions from a first dielectric material to a second dielectric material, where the first dielectric material comprises a first compound that includes silicon, titanium, and oxygen, the second dielectric material comprises a second compound that includes silicon, titanium, and oxygen, and the first compound has a smaller amount of titanium (e.g., and a larger amount of silicon) than the second compound.

Preferably, the first graded film region 9 transitions from the material of inner film region 30 (i.e., from the first transparent dielectric material) to the material of intermediate film region 50 (i.e., to the second transparent dielectric material). In more detail, the first graded film region 9 preferably is characterized by a gradual decrease in concentration of the first transparent dielectric material and a coextensive gradual increase in concentration of the second transparent dielectric material. The second graded film region 9' preferably transitions from the material of intermediate film region 50 (i.e., from the second transparent dielectric material) to the material of outer film region 70 (i.e., to the third transparent dielectric material). In more detail, the second graded film region 9' preferably is characterized by a gradual decrease in concentration of the second transparent dielectric material and a coextensive gradual increase in concentration of the third transparent dielectric material.

In certain preferred embodiments, the homogenous inner film region 30 comprises silicon dioxide as the first transparent dielectric material, the homogenous intermediate film region 50 comprises zirconium oxide as the second transparent dielectric material, and the homogenous outer film region 70 comprises titanium oxide as the third transparent dielectric material. Preferably, the inner film region 30 consists essentially of silicon dioxide, the intermediate film region 50 consists essentially of zirconium oxide, and the outer film region 70 consists essentially of titanium oxide. In these embodiments, the first graded film region 9 preferably transitions gradually from silicon dioxide to zirconium oxide, and the second graded film region 9' preferably transitions gradually from zirconium oxide to titanium oxide. In one such embodiment, the thus coated substrate is untempered (i.e., the coating has not been subjected to a post-deposition glass tempering process), the silica of region 30 is entirely or substantially amorphous, and the titania of region 70 is entirely or substantially amorphous. The sputtered coating described at the end of the present disclosure (e.g., in the detail of an exemplary three coat zone set-up), when untempered, is one example that is expected to be advantageous. In another such embodiment, the thus coated substrate is tempered (e.g., the substrate can be glass and the thus coated glass can have been subjected to a conventional glass tempering process), the silica of region 30 is entirely or substantially amorphous, the zirconia of region 50 is crystalline, and the titania of region 70 comprises $TiO_2$ crystals (e.g., region 70 can comprise amorphous and crystalline domains, such as $TiO_2$ crystals in a bed of entirely or substantially amorphous titania). The sputtered claims described at the end of the present disclosure, when tempered, is one example that is expected to be advantageous.

In certain embodiments, the homogenous inner film region 30 has a thickness of between about 40 Å and about 200 Å, the first graded film region 9 has a thickness of between about 20 Å and about 100 Å, the homogenous intermediate film region 50 has a thickness of between about 40 Å and about 160 Å, the second graded film region 9' has a thickness of between about 20 Å and about 100 Å, and the homogenous outer film region has a thickness of between about 40 Å and about 160 Å. Embodiments of this nature are particularly advantageous when silicon dioxide, zirconium oxide, and titanium oxide are used respectively for the first, second, and third dielectric materials.

The graded photocatalytic coating (whether having one or more graded film regions) has a surprisingly small thickness. In certain preferred embodiments, the coating 40 has a total optical thickness (i.e., the product of actual thickness and refractive index) of less than about 1,380 Å (and/or an actual thickness of less than about 600 Å), more preferably less than about 920 Å (and/or an actual thickness of less than about 400 Å), and perhaps optimally less than about 690 Å (and/or an actual thickness of less than about 300 Å). In some cases, the optical thickness of the coating is between about 250 Å and about 645 Å, and/or the actual thickness of the coating is between about 110 Å and about 280 Å. Providing the coating at such exceptionally small thicknesses is desirable for optimizing its optical properties (e.g., maximizing visible transmittance, minimizing visible reflectance: hence minimizing dirt appearance, and establishing good color) and for minimizing stress in the coating (thus maximizing coating adhesion/decreasing the risk of delamination). Tables 1 and 2 exemplify certain embodiments wherein the coating 40 has a total actual thickness of about 275 Å and about 125 Å, respectively.

TABLE 1

| Distance from substrate | Silicon dioxide concentration | Zirconium oxide concentration | Titanium oxide concentration |
| --- | --- | --- | --- |
| 25 Å | 100% | 0% | 0% |
| 50 Å | 100% | 0% | 0% |
| 75 Å | 66% | 34% | 0% |
| 100 Å | 34% | 66% | 0% |
| 125 Å | 0% | 100% | 0% |
| 150 Å | 0% | 100% | 0% |
| 175 Å | 0% | 66% | 34% |
| 200 Å | 0% | 34% | 66% |
| 225 Å | 0% | 0% | 100% |
| 250 Å | 0% | 0% | 100% |
| 275 Å | 0% | 0% | 100% |

TABLE 2

| Distance from substrate | Silicon dioxide concentration | Zirconium oxide concentration | Titanium oxide concentration |
| --- | --- | --- | --- |
| 25 Å | 0% | 100% | 0% |
| 50 Å | 0% | 66% | 34% |
| 75 Å | 0% | 34% | 66% |
| 100 Å | 0% | 0% | 100% |
| 125 Å | 0% | 0% | 100% |

Table 2 above exemplifies certain particularly preferred embodiments wherein the coating 40 has only one graded film region and a total optical thickness of less than about 345 Å (and/or a total actual thickness of less than about 150 Å). In one class of these particularly preferred embodiments, the coating 40 comprises (or consists essentially of, or consist of) sputtered film. Preferably, the entire coating is sputtered. Various materials can be used in the graded film region of the present embodiments. Preferably, the coating in the present embodiments comprises titania, which in some cases is amorphous or substantially amorphous. In one embodiment, the titania comprises $TiO_2$ crystal inclusions in (e.g., in a bed of) entirely or substantially amorphous titania. The coating can optionally begin with a homogenous silica film region, which is graded into a homogenous titania film region. If so desired, the titania film region can define an exterior face of the coating having an average surface roughness of less than 2 nm, perhaps more preferably less than 1.8 nm, and perhaps optimally less than 1.5 nm. The exemplary sputtering conditions described at the end of this disclosure can be used to produce such a coating.

Figure 2:
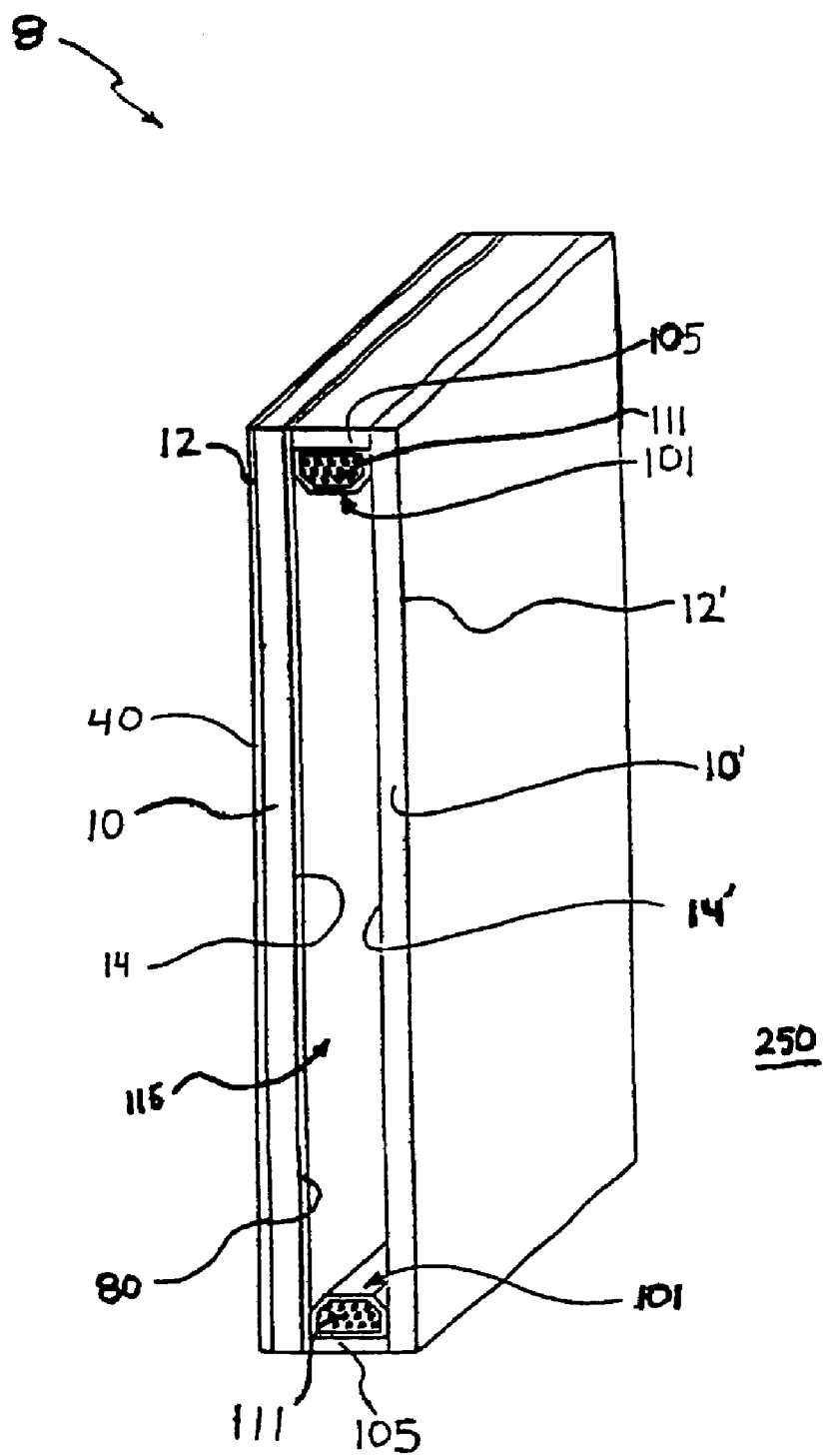
FIG. 2 is a schematic perspective cross-sectional view of an insulating glass unit bearing a graded photocatalytic coating in accordance with certain embodiments of the invention.

In certain embodiments, the invention provides a monolithic substrate (e.g., a monolithic pane or film-like substrate) bearing the graded photocatalytic coating 40. In other embodiments, the invention provides an IG unit bearing the present coating 40. IG units are well known. FIG. 2 depicts one example of an IG unit 8 that can be provided in accordance with the invention. The invention, however, is not limited to practice with any particular type of IG unit. To the contrary, all aspects of invention can be practiced with IG units of any type (fused all-glass units, vacuum units, insulated sash units, etc.). Thus, the illustrated IG unit type is not to be construed as limiting to the invention. Nor is the invention to be construed as being limited to IG unit embodiments. Rather, the invention provides a variety of monolithic substrate embodiments (including mirrors, single-pane windows, etc.). Further, while the term insulating "glass" unit is used in the present disclosure, it is to be understood that the panes need not be formed of glass. Rather, any suitable substrate can be used.

The IG unit 8 shown in FIG. 2 includes a first pane 10 and a second pane 10', together forming a pair of spaced-apart panes. The panes 10, 10' bound a between-pane space 115 therebetween and an exterior space 250 thereabout. The panes have confronting inner surfaces 14, 14' oriented toward the between-pane space 115 and opposed outer surfaces 12, 12' oriented away from the between-pane space 115. In the embodiment of FIG. 2, the panes 10, 10' are held in a spaced-apart configuration (e.g., in a substantially parallel spaced-apart relationship) by a spacer 101. The spacer joins the peripheral inner surfaces of the panes. Thus, the spacer 101 and the confronting inner surfaces 14, 14' of the panes 10, 10' together define the between-pane space 115. Useful IG units, components thereof, and methods of manufacturing and using IG units are described in U.S. patent application Ser. No. 10/076,211, the entire teachings of which are incorporated herein by reference.

In the preferred embodiment of FIG. 2, the illustrated IG unit 8 is provided with two coatings: the graded photocatalytic coating 40 on the outer surface 12 of the exterior pane 10 and a low-emissivity coating 80 on the inner surface 14 of the exterior pane 10. The low-emissivity coating 80 is optional and, when provided, can alternatively be on the inner surface 14' of the interior pane 10'. Generally, any desired low-emissivity coating can be used on the IG unit 8. In one embodiment, the low-emissivity coating has a particularly small total thickness of transparent dielectric film between surface 14 and a silver-containing film of the coating, this physical thickness being less than 295 angstroms, optionally less than 260 angstroms, and in some cases even less than 200 angstroms (e.g., 160 angstroms or less). Further, the invention provides certain particularly advantageous embodiments wherein the IG unit 8 is provided with a uniquely preferred low-emissivity coating, which facilitates exceptional properties when provided on the IG unit 8 in combination with the graded photocatalytic coating 40. The uniquely preferred low-emissivity coating is a "zebra" coating of the nature described in U.S. patent application Ser. No. 09/728,435, entitled "Haze-Resistant Transparent Film Stacks", or U.S. patent application Ser. No. 10/876,254, entitled "Concentration-Modulated Low-Emissivity Coatings", the entire teachings of each of which are incorporated herein by reference.

Figure 3:
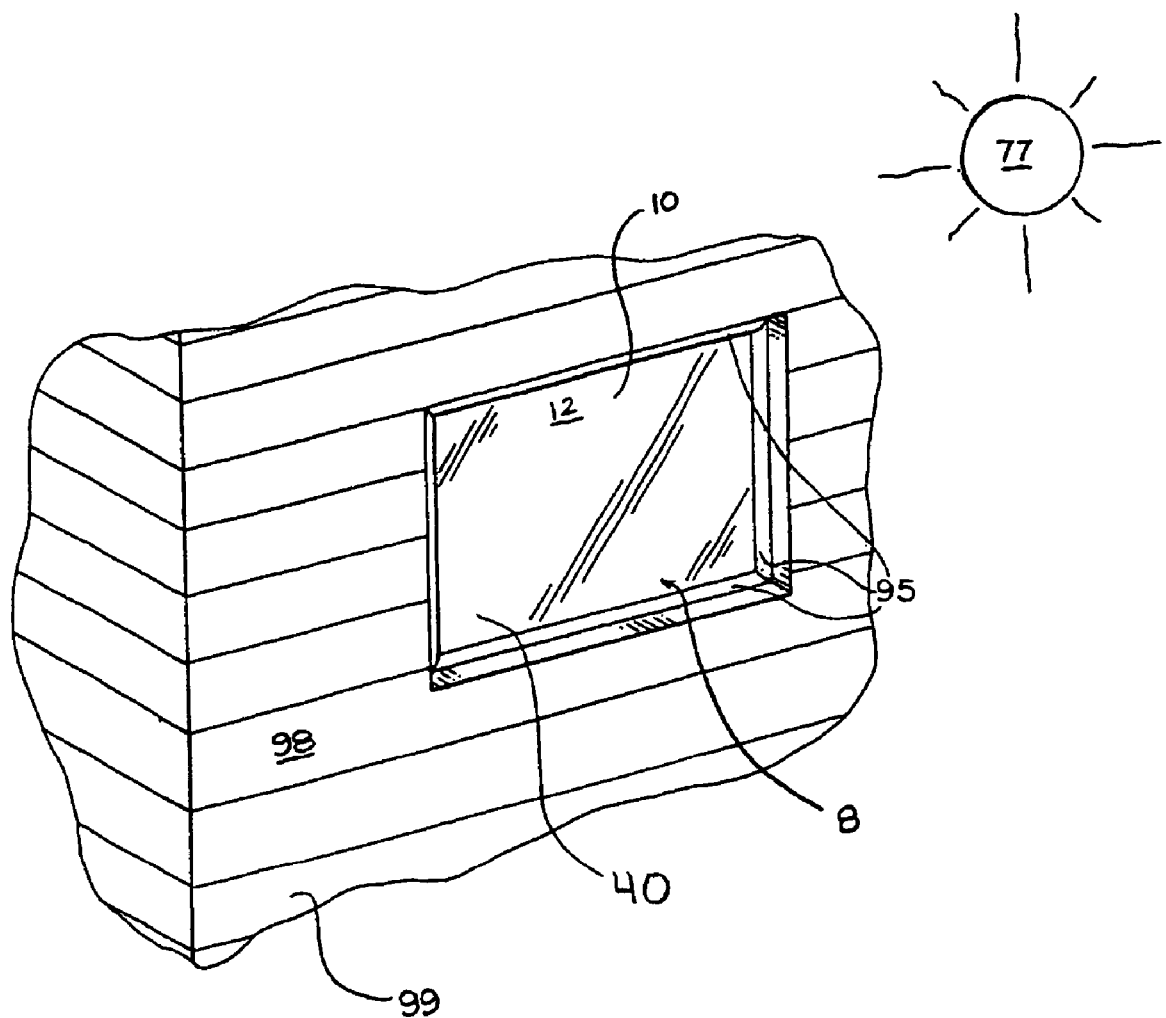
FIG. 3 is a broken-away perspective view of a glazing that bears a graded photocatalytic coating and has been mounted on the outer wall of a building in accordance with certain embodiments of the invention.

With continued reference to FIG. 2, the graded photocatalytic coating 40 preferably is on the "first" surface of the IG unit 8, while the optional low-emissivity coating 80 preferably is on the "second" surface of the IG unit 8. This is perhaps best appreciated by referring to FIG. 2 (which details the IG unit 8) in view of FIG. 3 (which shows the IG unit 8 mounted on a frame in an exterior wall 98 of a building 99). Generally, the "first" (or "#1") surface is that which faces (i.e., is exposed to) an outdoor environment. Accordingly, it is the #1 surface that radiation from the sun 77 first strikes. In FIG. 3, the outer surface 12 of the exterior pane (i.e., the outboard pane) 10 is the so-called first surface. Moving from the #1 surface toward the interior of the building 99, the next surface is the "second" (or "#2") surface. Thus, the inner surface 14 of the exterior pane 10 is the so-called second surface. Moving further toward the interior of the building 99, the next surface is the "third" (or "#3") surface, followed by the "fourth" (or "#4") surface. Thus, the inner surface 14' of the interior pane (i.e., the inboard pane) 10' is the third surface, and the outer surface 12' of this pane 10' is the fourth surface.

The graded photocatalytic coating 40 has a number of exceptional properties. The ensuing discussion reports several of these properties. In some cases, properties are reported in the context of a single (i.e., monolithic) pane 10 bearing the graded photocatalytic coating 40 on one major surface 12 (the "present pane"). Here, the reported properties have been determined for a pane of 2.2 mm soda-lime float glass. In other cases, properties are reported in the context of an IG unit 8 having the graded photocatalytic coating 40 on the #1 surface and the uniquely preferred low-emissivity coating 80 on the #2 surface (the "present IG unit"). In these cases, the reported properties have been determined for an IG unit wherein both panes are 2.2 mm soda-lime float glass with a ½ inch between-pane space filled with an insulative gas mix of 50% argon and 50% air. These specifics, of course, are by no means limiting to the invention. Absent an express indication to the contrary, the present discussion reports determinations made using the well-known Window 4.1 program under standard ASHRAE conditions.

The graded photocatalytic coating 40 exhibits desirable self-cleaning properties. As noted above, the coating 40 comprises photocatalytic film, such as $TiO_2$ film, which has the ability to break down organic materials that come into contact with the coating. The present coating 40 provides a desirable level of photoactivity while at the same time providing exceptional soil removal characteristics and minimal dirt appearance. This balance of properties is highly desirable, particularly for window coatings.

The photoactivity of the graded photocatalytic coating 40 could be increased by making the coating 40 thicker. For example, the thickness of the photocatalytic film (e.g., $TiO_2$) in the coating could be increased to provide more electron-hole pairs, thereby increasing photoactivity. Providing the coating 40 at a greater thickness, however, would increase the visible reflectance of the coating, hence increasing its dirt appearance (i.e., its tendency to show dirt). It is common in the art to provide photocatalytic coatings at relatively great thicknesses (e.g., on the order of about 1,000 Å and higher), so as to maximize the photoactivity of these coatings. This, however, has the effect of increasing the visible reflectance of the coating to a more mirror-like level, such that the appearance of dirt on the coating is greatly exaggerated. Windows bearing these coatings tend to look noticeably more dirty than uncoated windows. As a result, these coatings have not fared particularly well in the marketplace.

The photoactivity of the present coating 40 could also be increased by making the coating more rough. For example, the surface roughness of the coating could be increased to provide more surface area for reaction, thereby increasing photoactivity. The present inventors, however, have discovered that the soil removal characteristics of a rough photocatalytic coating are less than ideal. For example, rough photocatalytic coatings provide myriad sites in which soil can cling. As a result, rough photocatalytic coatings tend not to flush clean with water sheeting (e.g., during normal window washing techniques), which is a highly desirable characteristic, particularly for window coatings. Moreover, the inventors have discovered that the soiling of rough photocatalytic coatings is particularly difficult to remove during cleaning. Thus, rough photocatalytic coatings tend to have soil removal characteristics that are less than ideal.

Preferably, the graded photocatalytic coating 40 has a lower surface roughness than is generally preferred for photocatalytic coatings. The surface roughness is selected to provide particularly low coating maintenance. As a result, windows bearing the present coating will stay cleaner, and will be easier to clean, than rough photocatalytic coatings. In certain embodiments, the graded photocatalytic coating 40 has an outer face 322 with an average surface roughness ($R_a$) of about 2 nm or less, perhaps more preferably less than 1.8 nm, and perhaps optimally less than 1.5 nm. The surface roughness of the present coating 40 is defined in terms deviations from the mean surface level. In particular, the surface roughness reported herein is the arithmetical mean surface roughness ($R_a$). This is the arithmetic average of the absolute deviations from the mean surface level. The arithmetical mean surface roughness of a coating is commonly represented by the equation: $R_a = 1/L \int_0^L |f(x)| dx$.

As noted above, photocatalytic coatings tend to have a higher visible reflectance than is preferred (e.g., in window applications). A tradeoff is sometimes made in photocatalytic coatings whereby the film selected to achieve a high level of photoactivity has the effect of restricting the visible reflectance to a level that is higher than ideal. As a result, windows bearing these coatings typically have a somewhat mirror-like appearance and dirt on these windows tends to be particularly noticeable. To the contrary, the present coating 40 has a very low visible reflectance and therefore mitigates these problems to a very acceptable level.

The present coating 40 can provide a monolithic or insulated exterior visible reflectance $R_v$ (off the photocatalytic film side of a monolithic pane, or off the photocatalytic film side of the exterior pane 10 of an IG unit 8) of less than about 15%. In fact, the present coating 40 can provide a monolithic or insulated exterior visible reflectance $R_v$ of less than about 13%. While the precise level of visible reflectance can be selected and varied in accordance with the present teachings, certain particularly preferred embodiments achieve an exterior reflectance $R_v$ of about 12%.

Thus, the graded photocatalytic coating can achieve substantially lower visible reflectance than is achieved by many photocatalytic coatings, which commonly show dirt to an unacceptable degree. The desirability of the coating's low visible reflectance in terms of minimal dirt appearance is expected to be readily appreciated on a qualitative level by observing a window bearing the present coating 40 in comparison to windows bearing high visible reflectance photocatalytic coatings. Over time, the present window is expected to look noticeably more clean than windows bearing highly reflective photocatalytic coatings. This is expected to be an exceptional, highly desirable feature of the graded photocatalytic coating 40.

The term "visible reflectance" is well known in the art. This term is used herein in accordance with its well-known meaning to refer to the percentage of all incident visible radiation that is reflected off the photocatalytic film side of the present pane or off the exterior (i.e., off the photocatalytic film side of the outboard pane 10) of the present IG unit 8. Visible reflectance is indicated herein as $R_v$, where v stands for visible. Skilled artisans will appreciate that the visible reflectance off the photocatalytic film side of the present pane includes not only visible radiation reflected at surface 12, but also visible radiation reflected at surface 14. Likewise, the visible reflectance off the exterior of the present IG unit 8 includes not only visible radiation reflected at surface 12, but also visible radiation reflected at surfaces 14, 14', and 12'.

The graded photocatalytic coating is also quite desirable for mirror applications. For example, the stress benefits of the present coating could be applied advantageously in mirror applications. Thus, the invention also provides embodiments wherein the coating 40 is provided on a mirror. In these embodiments, the visible reflection of the mirror, of course, desirably is very high. Accordingly, in certain embodiments, the graded photocatalytic coating 40 is provided on a mirror or another highly reflective substrate 10.

Figure 4:
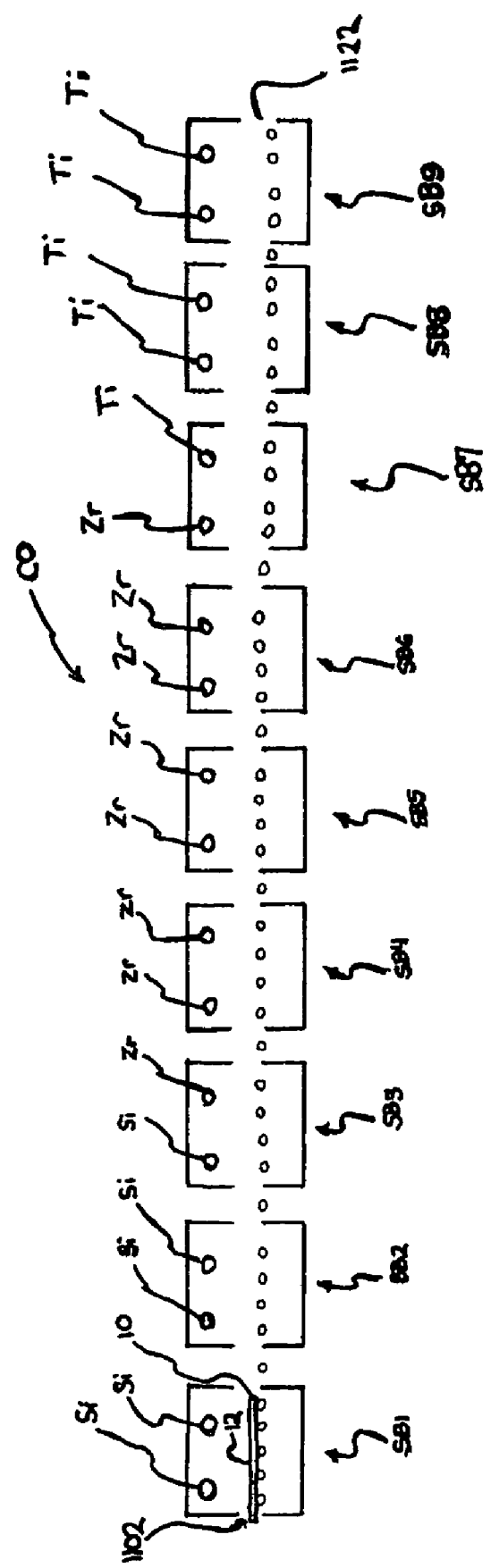
FIG. 4 is a schematic side view of a coater adapted for use in producing a graded photocatalytic coating in accordance with certain embodiments of the invention.

FIG. 4 is a schematic side view of a coater CO that is adapted for use in producing a coating in accordance with certain embodiments of the invention. Here, the coater CO is a sputter coater (e.g., a sputtering line) comprising a series of sputter deposition bays SB1-SB9. An exemplary method for producing one particular coating in accordance with certain embodiments of the invention will now be described.

In one method, the substrate 10 is positioned at an inlet of the coater CO and conveyed to a desired coat zone (e.g., to a first bay SB1 of the desired coat zone). This coat zone is provided with three sputtering bays SB1, SB2, SB3, each having two sputtering targets. In each bay of the coater CO, the illustrated dual-rotatable targets are operated using an AC power supply, although this is not required. Of the six targets in this coat zone, the first five are silicon targets (optionally including some aluminum or another material to enhance the conductivity of the target). The first four of these silicon targets are sputtered in an oxidizing atmosphere to deposit silicon dioxide (e.g., over a first surface 12 of the substrate 10). The oxidizing atmosphere may consist essentially of oxygen (e.g., about 100% $O_2$). Alternatively, this atmosphere may comprise $Ar/O_2$ (e.g., oxygen and up to about 40% argon). Sputtering can be performed, for example, at a pressure of about 3.5 mtorr. The silicon targets are sputtered at a power level of about 75 kW. As shown in FIG. 4, the final bay SB3 of this coat zone has two targets, the first being a silicon target, the second being a zirconium target. These two targets are sputtered in a common (i.e., shared) atmosphere, which preferably is an oxidizing atmosphere such as oxygen or a mixture of Ar and $O_2$ (e.g., oxygen and up to about 40% argon) at a pressure of about 3.5 mtorr. The silicon and zirconium targets in this bay SB3 are operated at a power level of about 75 kW. The substrate 10 is conveyed beneath all six of the targets in this coat zone at a rate of about 300 inches per minute, while sputtering each of these targets under the noted conditions.

The substrate 10 is then conveyed into a subsequent coat zone (e.g., into a first bay SB4 of such zone). This coat zone has three sputtering bays SB4, SB5, SB6, each having two sputtering targets. All six targets in this coat zone are zirconium targets. These zirconium targets are operated at a power level of about 90 kW, and they are sputtered in an oxidizing atmosphere such as oxygen or a mixture of Ar and $O_2$ (e.g., oxygen and up to about 40% argon) at a pressure of about 3.5 mtorr. The substrate 10 is conveyed beneath all six of these targets at a rate of about 300 inches per minute, while sputtering each of these targets under the noted conditions.

The thus coated substrate is then conveyed into another coat zone (e.g., into a first bay SB7 of such zone). This coat zone has three sputtering bays SB7, SB8, SB9, each having two sputtering targets. The first target in this coat zone is a zirconium target. The second target in this coat zone is a titanium target. As shown in FIG. 4, these two targets are both mounted in the same sputtering bay SB7. Thus, they are sputtered in a common atmosphere, which preferably is an oxidizing atmosphere such as oxygen or a mixture of Ar and $O_2$ (e.g., oxygen and up to about 40% argon) at a pressure of about 3.5 mtorr. These two targets are operated at a power level of about 90 kW. The last four targets of this coat zone are titanium targets. They are operated at a power level of about 90 kW, and they are sputtered in an oxidizing atmosphere such as oxygen or a mixture of Ar and $O_2$ (e.g., oxygen and up to about 40% argon) at a pressure of about 3.5 mtorr. The substrate 10 is conveyed beneath all six of the targets in this coat zone at a rate of about 300 inches per minute, while sputtering each of these targets under the noted conditions. This completes a coating 40 in accordance with one embodiment.

The invention also provides methods for depositing a photocatalytic coating on a substrate. In some embodiments, the method comprises depositing a photocatalytic coating over a major surface of a substrate such that the coating as deposited comprises, in sequence outwardly a first graded film region and a second graded film region. The first graded film region has a substantially continuously decreasing concentration of a first transparent dielectric material and a substantially continuously increasing concentration of a second transparent dielectric material. The second graded film region has a substantially continuously decreasing concentration of the second transparent dielectric and a substantially continuously increasing concentration of a third transparent dielectric material. The third transparent dielectric material comprises a photocatalyst. The first and second graded film regions are preferably each deposited so as to have a thickness of less than about 100 angstroms, more preferably less than about 75 angstroms.

Methods for sputtering depositing a graded photocatalytic coating on a substrate are also provided. While sputtering depositing is a preferred method for depositing a photocatalytic coating, other methods are within the scope of the invention. In certain embodiments, a photocatalytic coating having a first graded film region and a second graded film region is deposited by sputtering. For example, the first graded film region in some embodiments is deposited by sputtering two targets in a shared atmosphere, the two targets being of different composition. Likewise, the second graded film region in some embodiments is deposited by sputtering two targets in a shared atmosphere, the two targets being of different composition. In one particularly preferred embodiment, the first graded film region is deposited by sputtering first and second targets in a shared atmosphere, the first target being a silicon-containing target, the second target being a zirconium containing-target, and wherein the second graded film region is deposited by sputtering third and fourth targets in a shared atmosphere, the third target being a zirconium-containing target, the fourth target being a titanium-containing target.

In other embodiments, a graded photocatalytic coating is sputter deposited over a major surface of a substrate such that the photocatalytic coating as deposited comprises at least one graded film region having a composition that transitions, with increasing distance from the substrate, from one transparent dielectric material to another, wherein at least one of these transparent dielectric materials comprises titania, and wherein the graded film region is deposited at a thickness of less than about 100 angstroms. The at least one graded film region is preferably deposited at a thickness of less than about 75 angstroms, more preferably less than about 50 angstroms.

The invention also provides a substrate having a graded photocatalytic coating deposited over a major surface of the substrate. The graded photocatalytic coating comprises at least one graded film region having a composition that transitions, with increasing distance from the substrate, from one transparent dielectric material to another, wherein at least one of these transparent dielectric materials comprises titania, and wherein the graded film region is deposited at a thickness of less than about 100 angstroms. The substrate preferably has a graded film region deposited at a thickness of less than about 75 angstroms, preferably less than about 50 angstroms. The graded photocatalytic coating is preferably deposited by sputtering, although other film deposition methods are within the scope of the invention.

Films of the present coating can be deposited using any deposition method known in the art. For example, methods of chemical vapor deposition, sputtering, evaporation, and pyrolysis are all suitable deposition methods. In preferred embodiments, the films are deposited by sputtering. Sputtering techniques and equipment are well known in the present art. For example, magnetron sputtering chambers and related equipment are commercially available from a variety of sources (e.g., Leybold and BOC Coating Technology). Useful magnetron sputtering techniques and equipment are also disclosed in U.S. Pat. Nos. 4,166,018 (Chapin) and 5,645,699 (Sieck), the entire teachings of each of which are incorporated herein by reference.

The thickness and structure of films in the present coating can be determined in various ways known to skilled artisans. For example, a Focused Ion Beam (FIB) instrument can be used to prepare electron transparent cross-sectional specimens. The specimens can be examined using, for example, two hundred KeV transmission electron microscopes, such as one dedicated high-resolution imaging instrument and another fully analytical instrument equipped with an X-ray energy-dispersive spectrometer. Selected area electron diffraction can be used to determine the crystallography of the coating. The present coating can also be examined using low magnification bright field and dark field images of the coating, energy-dispersive X-ray (EDX) spectra from the coating, and high-resolution lattice-fringe images.

While certain preferred embodiments of the invention have been described, it should be understood that various changes, adaptations, and modifications may be made therein without departing from the spirit of the invention and the scope of the appended claims.

What is claimed is:

1. A substrate bearing a photocatalytic coating comprising, in sequence outwardly:
   a) a first graded film region having a substantially continuously decreasing concentration of a first transparent dielectric material and a substantially continuously increasing concentration of a second transparent dielectric material;
   b) a second graded film region having a substantially continuously decreasing concentration of the second transparent dielectric material and a substantially continuously increasing concentration of a third transparent dielectric material, the third transparent dielectric material comprising a photocatalyst; and wherein the coating consists essentially of film regions of different transparent dielectric materials interlocked by continuous transition, and the coating does not include any discrete film interfaces, the coating comprising a homogenous intermediate film region that is bounded by and gradually transitions into the first and second graded film regions, the homogenous intermediate film region having a thickness and comprising said second transparent dielectric material, the homogenous intermediate film region having a composition that is substantially uniform across its thickness.

2. The substrate of claim 1 wherein the photocatalytic coating has a total optical thickness of less than about 920 Å.

3. The substrate of claim 1 wherein the photocatalytic coating has an average surface roughness of about 2 nm or less.

4. The substrate of claim 1 wherein the thickness of the homogenous intermediate film region is between about 40 Å and about 160 Å.

5. The substrate of claim 1 wherein the coating has a total thickness of less than about 300 angstroms.

6. The substrate of claim 1 wherein the coating has a total thickness of less than about 150 angstroms.

7. The substrate of claim 1 wherein the substrate has an exterior photocatalytic film-side visible reflectance of less than about 15%.

8. The substrate of claim 7 wherein the exterior photocatalytic film-side visible reflectance is less than about 13%.

9. The substrate of claim 1 wherein the photocatalytic coating comprises a homogenous inner film region between the substrate and the first graded film region, the homogenous inner film region comprising said first transparent dielectric material.

10. The substrate of claim 9 wherein the homogenous inner film region has a thickness of between about 40 Å and about 200 Å.

11. The substrate of claim 9 wherein said first transparent dielectric material is silicon dioxide, such that the homogenous inner film region comprises silicon dioxide.

12. The substrate of claim 11 wherein the homogenous inner film region consists essentially of silicon dioxide.

13. The substrate of claim 1 wherein said second transparent dielectric material is zirconium oxide, such that the homogenous intermediate film region comprises zirconium oxide.

14. The substrate of claim 13 wherein the homogenous intermediate film region consists essentially of zirconium oxide.

15. The substrate of claim 1 wherein the photocatalytic coating comprises a homogenous outer film region further from the substrate than the second graded film region, the homogenous outer film region comprising said third transparent dielectric material.

16. The substrate of claim 15 wherein the homogenous outer film region has a thickness of between about 40 Å and about 160 Å.

17. The substrate of claim 15 wherein said third transparent dielectric material is titanium oxide, such that the homogenous outer film region comprises titanium oxide.

18. The substrate of claim 17 wherein the homogenous outer film region consists essentially of titanium oxide.

19. A substrate bearing a photocatalytic coating comprising, in sequence outwardly:

a) a first graded film region having a substantially continuously decreasing concentration of silicon dioxide and a substantially continuously increasing concentration of zirconium oxide;

b) a second graded film region having a substantially continuously decreasing concentration of zirconium oxide and a substantially continuously increasing concentration of titanium oxide; and wherein the coating consists essentially of film regions of different transparent dielectric materials interlocked by continuous transition, and the coating does not include any discrete film interfaces, each graded film region extending between two homogenous film regions of different composition, each graded film region having a thickness of greater than about 10 angstroms but less than about 75 angstroms.

20. The substrate of claim 19 wherein the photocatalytic coating comprises a homogenous inner film region between the substrate and the first graded film region, the homogenous inner film region consisting essentially of silicon dioxide, a homogenous intermediate film region between the first graded film region and the second graded film region, the homogenous intermediate film region consisting essentially of zirconium oxide, and a homogenous outer film region further from the substrate than the second graded film region, the homogenous outer film region consisting essentially of titanium oxide.

21. The substrate of claim 20 wherein the homogenous inner film region has a thickness of between about 40 Å and about 200 Å, the homogenous intermediate film region has a thickness of between about 40 Å and about 160 Å, and the homogenous outer film region has a thickness of between about 40 Å and about 160 Å.

22. The substrate of claim 19 wherein the coating has a total thickness of less than about 300 angstroms.

23. The substrate of claim 19 wherein the coating has a total thickness of less than about 150 angstroms.

24. A substrate bearing a graded photocatalytic coating, the graded photocatalytic coating comprising at least one graded film region having a composition that transitions, with increasing distance from the substrate, from one transparent dielectric material to another, the graded photocatalytic coating having an exterior photocatalytic film-side visible reflectance of less than about 13%; wherein the coating consists essentially of film regions of different transparent dielectric materials interlocked by continuous transitions, the coating has a total thickness of less than about 150 angstroms, and the graded film region has a thickness of greater than about 10 angstroms but less than about 75 angstroms.

25. The substrate of claim 23 wherein the graded photocatalytic coating is a sputtered coating.

26. The substrate of claim 24 wherein the graded film region has a thickness of greater than about 10 angstroms but less than about 50 angstroms.

27. The substrate of claim 24 wherein the substrate is part of an IG unit provided with two coatings: the graded photocatalytic coating and a low-emissivity coating, the two coatings being on opposite sides of the substrate, the low-emissivity coating having less than 200 angstroms of transparent dielectric film between the substrate and a silver-containing film of the low-emissivity coating.

28. The substrate of claim 27 wherein the low-emissivity coating has less than 160 angstroms of transparent dielectric film between the substrate and said silver-containing film.

29. A substrate bearing a graded photocatalytic coating, the coating being deposited over a major surface of the substrate and comprising at least one graded film region having a composition that transitions, with increasing distance from the substrate, from one transparent dielectric material to another, wherein at least one of these transparent dielectric materials comprises titania, the graded film region having a thickness of greater than about 10 angstroms but less than about 75 angstroms; wherein the coating consists essentially of film regions of different transparent dielectric materials interlocked by continuous transition.

30. The substrate of claim 29 wherein the graded film region is deposited at a thickness of greater than about 10 angstroms but less than about 50 angstroms.

31. The substrate of claim 29 wherein the graded film region is deposited at a thickness of greater than about 10 angstroms but less than about 40 angstroms.

32. The substrate of claim 29 wherein the graded photocatalytic coating is a sputtered coating.

33. The substrate of claim 29 wherein the coating has a total thickness of less than about 300 angstroms.

34. The substrate of claim 29 wherein the coating has a total thickness of less than about 150 angstroms.

35. The substrate of claim 29 wherein the substrate is part of an IG unit provided with two coatings: the graded photocatalytic coating and a low-emissivity coating, the two coatings being on opposite sides of the substrate, the low-emissivity coating having less than 200 angstroms of transparent dielectric film between the substrate and a silver-containing film of the low-emissivity coating.

36. The substrate of claim 35 wherein the low-emissivity coating has less than 160 angstroms of transparent dielectric film between the substrate and said silver-containing film.

* * * * *